United States Patent
Morgan et al.

(10) Patent No.: US 10,797,479 B2
(45) Date of Patent: Oct. 6, 2020

(54) POWER DISTRIBUTION SYSTEMS AND METHODS OF PERFORMING GROUND FAULT DETECTION IN POWER DISTRIBUTION SYSTEMS WITH A COMMUNICATION NETWORK

(71) Applicant: ABB Schweiz AG, Baden (CH)

(72) Inventors: Shawn Alan Morgan, Goshen, KY (US); Lathom Alexander Louco, Salem, VA (US); Jeffrey Marcel Kubascik, Grand Rapids, MI (US); Lucas Ray Mallory, Louisville, KY (US); Craig Benjamin Williams, Louisville, KY (US)

(73) Assignee: ABB Schweiz AG, Baden (CH)

( * ) Notice: Subject to any disclaimer, the term of this patent is extended or adjusted under 35 U.S.C. 154(b) by 785 days.

(21) Appl. No.: 15/439,438

(22) Filed: Feb. 22, 2017

(65) Prior Publication Data
US 2018/0241192 A1    Aug. 23, 2018

(51) Int. Cl.
*H02H 3/00*    (2006.01)
*H02H 9/08*    (2006.01)
(Continued)

(52) U.S. Cl.
CPC ....... *H02H 1/0092* (2013.01); *G01R 19/2513* (2013.01); *G01R 31/50* (2020.01);
(Continued)

(58) Field of Classification Search
CPC .......... H02H 1/0092; H02H 3/28; H02H 3/32; H02H 3/16; G01R 31/025
(Continued)

(56) References Cited

U.S. PATENT DOCUMENTS 5,629,825 A    5/1997  Wallis et al.
6,347,027 B1 *  2/2002  Nelson .................. H02H 1/0092
                                                    361/64
(Continued)

FOREIGN PATENT DOCUMENTS

AU            690924 B2    5/1998
CA          2253512 C     11/2005
(Continued)

OTHER PUBLICATIONS

GE Digital Energy, "Multilin 850 Innovative Feeder Protection System for Industrial and Utility Feeder Applications."
(Continued)

*Primary Examiner* — Jared Fureman
*Assistant Examiner* — Lucy M Thomas
(74) *Attorney, Agent, or Firm* — Barnes & Thornburg LLP

(57) ABSTRACT

A method of operating an electrical power distribution system including a plurality of circuit protection devices and an additional circuit protection device communicatively coupled by a communications network is described. The method includes transmitting, by each circuit protection device of the plurality of circuit protection devices, an electrical current communication to the communication network, the electrical current communication including an indication of an electrical current detected by the transmitting circuit protection device formatted according to a network communication protocol of the communication network. The additional circuit protection device receives the electrical current communications from the plurality of circuit protection devices and determines, based on the received electrical current communications, whether a ground fault condition exists in the electrical power distribution system.

20 Claims, 10 Drawing Sheets

(51) Int. Cl.
*H02H 1/00* (2006.01)
*H02H 7/26* (2006.01)
*H02H 3/28* (2006.01)
*H02H 3/32* (2006.01)
*G01R 19/25* (2006.01)
*G01R 31/50* (2020.01)
*H02H 3/33* (2006.01)
*H02H 3/16* (2006.01)

(52) U.S. Cl.
CPC ............ *H02H 1/0061* (2013.01); *H02H 3/28* (2013.01); *H02H 3/32* (2013.01); *H02H 7/262* (2013.01); *H02H 7/263* (2013.01); *H02H 3/16* (2013.01); *H02H 3/33* (2013.01); *Y02E 60/725* (2013.01); *Y04S 10/20* (2013.01)

(58) Field of Classification Search
USPC ........................................................ 361/2, 42
See application file for complete search history.

(56) References Cited

U.S. PATENT DOCUMENTS

| | | | |
|---|---|---|---|
| 6,999,291 B2* | 2/2006 | Andarawis | ............ H01H 83/20 361/64 |
| 7,570,471 B2 | 8/2009 | Weiher et al. | |
| 7,657,763 B2 | 2/2010 | Nelson et al. | |
| 8,280,653 B2 | 10/2012 | Lagree | |
| 2003/0107860 A1 | 6/2003 | Dougherty | |
| 2007/0263643 A1 | 11/2007 | Wadhawan | |
| 2009/0267792 A1 | 10/2009 | Crichlow | |
| 2009/0315668 A1 | 12/2009 | Leete, III et al. | |
| 2010/0204933 A1 | 8/2010 | Lagree | |
| 2011/0161468 A1 | 6/2011 | Tuckey et al. | |
| 2013/0271886 A1 | 10/2013 | Cull et al. | |
| 2013/0300566 A1 | 11/2013 | Kumfer et al. | |
| 2015/0160670 A1 | 6/2015 | Meliopoulos et al. | |
| 2015/0227149 A1 | 8/2015 | Makanawala | |
| 2016/0126717 A1 | 5/2016 | Valdes et al. | |
| 2016/0141861 A1 | 5/2016 | Dougherty et al. | |
| 2016/0225562 A1 | 8/2016 | Franks et al. | |
| 2016/0365214 A1 | 12/2016 | Franke et al. | |

FOREIGN PATENT DOCUMENTS

| | | |
|---|---|---|
| CN | 1430234 A | 7/2003 |
| CN | 10237716 A | 3/2012 |
| CN | 102946089 A | 2/2013 |
| CN | 203352291 U | 12/2013 |
| CN | 104242461 A | 12/2014 |
| CN | 104269919 A | 1/2015 |
| CN | 105606957 A | 5/2016 |
| IN | 268738 B | 9/2015 |
| IN | 201401322 I1 | 11/2015 |
| IN | 201403737 I1 | 11/2015 |
| WO | 2015126977 A1 | 8/2015 |
| WO | 2016086407 A1 | 6/2016 |

OTHER PUBLICATIONS

Beitollahi, Hakem, et al. "Peer-to-Peer Networks Applied to Power Grid," ResearchGate, Jan. 2007, 9 pages.

Akyol, BA, et al., "A Survey of Wireless Communications for the Electric Power System," U.S. Department of Energy, Jan. 2010, 73 pages.

Barber, Jane, "Enhancing Uptime and Decreasing Risk," Electrical Construction & Maintenance, http://ecmweb.com/design/enhancing-uptime-and-decreasing-risk, Apr. 3, 2014, 5 pages.

Siemens, "Smart-Gear, Power Distribution Solution," http://www.energy.siemens.com/us/pool/us/power-distribution/ansi-standard-products/medium-voltage-switchgear/smart-gear-power-distribution-solution/downloads/smart-geartm%20power%20distribution%20solution%20flyer%20(e50001-u229-a403-x-us00).pdf, 2 page.

ABB, QT Technical Application Papers, "Bus communication with ABB circuit-breakers," Jan. 2009, 66 pages.

Siemens, "White Paper Ground Fault Application Guide,3-Pole WL Low Voltage Power Circuit Breakers," 2014, 20 pages.

Kojovic, Ljubomir A., "Integration of Protection, Control, and Metering Functions," CIGRE 2012, 8 pages.

* cited by examiner

POWER DISTRIBUTION SYSTEMS AND METHODS OF PERFORMING GROUND FAULT DETECTION IN POWER DISTRIBUTION SYSTEMS WITH A COMMUNICATION NETWORK

BACKGROUND

The present application relates generally to power distribution systems and, more particularly, to methods of operating power distribution systems including a communication network.

Known power distribution systems include a plurality of switchgear lineups including circuit breakers that are each coupled to one or more loads. The circuit breakers typically include a trip unit that controls the circuit breakers based upon sensed current flowing through the circuit breakers. More specifically, the trip unit causes current flowing through the circuit breaker to be interrupted if the current is outside of acceptable conditions.

Some known circuit breakers are programmed with one or more current thresholds (also known as "pickup" thresholds) that identify undesired current levels for the circuit breaker. If a fault draws current in excess of one or more current thresholds for a predetermined amount of time, for example, the trip unit typically activates the associated circuit breaker to stop current from flowing through the circuit breaker. However, in power distribution systems that include a plurality of circuit breakers, a typical arrangement uses a hierarchy of circuit breakers. Large circuit breakers (i.e., circuit breakers with a high current rating) are positioned closer to a power source than lower current feeder circuit breakers and feed the lower current feeder circuit breakers. Each feeder circuit breaker may feed a plurality of other circuit breakers, which connect to loads or other distribution equipment.

A fault may occur anywhere in the circuit breaker hierarchy. When a fault occurs, each circuit breaker that has the same fault current flowing through it may detect different amounts of fault current as a result of varying sensor sensitivities and/or tolerances. When the fault occurs, the circuit breaker closest to the fault should operate to stop current from flowing through the circuit breaker. If a circuit breaker higher in the hierarchy trips, multiple circuits or loads may unnecessarily lose service.

To accommodate for the varying tolerances and to ensure that multiple circuit breakers do not unnecessarily trip based on the same fault current, the current thresholds of at least some known circuit breakers are nested with each other to avoid overlapping fault current thresholds. In some other known systems, circuit breakers in a lower tier send coordination or blocking signals to higher tier circuit breakers upon detection of a fault current and the upper tier circuit breakers' operation is coordinated with the operation of the lower tier circuit breaker in response to the blocking signal. The signals are typically transmitted over a dedicated connection between a blocking signal output in the lower tier circuit breaker and a blocking signal input in each upper tier circuit breaker with which the lower tier circuit breaker must be coordinated. The blocking/coordination signals are typically a simple binary (on/off) signal in which the presence of a voltage indicates a blocking signal and the absence of a voltage indicates the absence of a blocking signal. Some known systems incorporate a third signal, such as a periodic pulse, to add an additional indication, such as to confirm there is no blocking signal but the connection between circuit breakers is still functioning. Such known systems do not provide any additional information from the lower tier circuit breaker to the upper tier circuit breakers in connection with the blocking signal.

In certain system topologies, circuit breakers known as ties, which connect distribution busses in the same tier of a system with multiple sources supplying multiple busses, cannot detect fault current direction. The trip unit in the tie does not know whether current is flowing through the tie from right to left or left to right. When a fault occurs the tie must send a blocking signal to upper tier devices on all connected sources. This results in the undesirable operation that all source devices are blocked when it may otherwise be desired that at least one of them not be blocked.

At least some known power distribution systems include circuit protection devices operable in at least two protection modes: a normal protection mode and a maintenance mode (also referred to sometimes as a Reduced Energy Let Through or RELT mode). In the normal protection mode, current thresholds (also known as "pickup" thresholds) that identify undesired current levels are set to protect equipment, such as a load or other protection devices. The maintenance mode is commonly activated by a person when the person will be interacting with a load or protection device downstream (in a lower tier) from a protection device. In the maintenance mode, the protection device's settings are adjusted to make it more sensitive to undesired current levels and, if possible, decrease the amount of time needed by the protection device to react to an undesired current level. Thus, a protection device is easier and/or quicker to trip when the maintenance mode is enabled. The maintenance mode of a protection device is typically manually enabled and disabled by a person. Failure of a person to enable a maintenance mode in a protection device in some known systems increases the danger to a person working downstream from the protection. Failure to return the protection device from the maintenance mode to the normal protection mode may increase the likelihood that the protection device will trip unnecessarily.

At least some known power distribution systems include circuit protection devices with ground fault detection capabilities. A circuit protection device that disconnects a circuit when it detects that electric current is not balanced between conductors, for example between a line conductor and a neutral conductor, may be referred to as a residual current device (RCD). RCDs include, for example, ground fault circuit interrupters (GFCIs), ground fault interrupters (GFIs), appliance leakage current interrupters (ALCIs), residual-current circuit breakers with overload protection (RCBOs), and electronic residual-current circuit breakers with overload protection (eRCBOs). Ground fault detection capabilities of a circuit protection device are often controlled based only on data that is collected directly by the circuit protection device without full knowledge concerning operation of other circuit protection devices or other portions of the power distribution system.

Some known power systems utilize relatively simple circuit protection devices in connection with a centralized controller. The centralized controller receives data from sensors disposed throughout the power distribution system. The centralized controller commands and coordinates operation of the various circuit protection devices in the power distribution system based on the sensed data.

BRIEF DESCRIPTION

In one aspect, an electrical power distribution system includes a plurality of circuit protection devices coupled to an electrical power source and an additional circuit protection device. Each circuit protection device of the plurality of circuit protection devices includes a network interface communicatively coupled to a communication network including the plurality of circuit protection devices, an electrical current sensor configured to detect an electrical current associated with its circuit protection device, a processor, and a memory device. The memory device stores instructions that, when executed by the processor, cause the processor to transmit, using the network interface, an electrical current communication to the communication network. The electrical current communication includes an indication of the detected electrical current associated with the circuit protection device formatted according to a network communication protocol of the communication network. The additional circuit protection device includes an additional network interface communicatively coupled to the communication network, an additional processor, and an additional memory device. The additional memory device stores instructions that, when executed by said additional processor, cause said additional processor to receive, using the additional network interface, the electrical current communications from the plurality of circuit protection devices, and determine, based on the received electrical current communications, whether a ground fault condition exists in the electrical power distribution system.

Another aspect is a circuit protection device for an electrical distribution system including a plurality of other circuit protection devices. The circuit protection device includes a network interface configured to be communicatively coupled to a communication network including the plurality of other circuit protection devices, a processor, and a memory device. The memory device stores instructions that, when executed by the processor, cause the processor to: receive, using the network interface, an electrical current communication from each other circuit protection device. The electrical current communication from each other circuit protection device includes an indication of an amount of an electrical current associated with the other circuit protection device. Based on the received electrical current communications, the processor determines whether a ground fault condition exists in the electrical power distribution system.

In yet another aspect, a method of operating an electrical power distribution system including a plurality of circuit protection devices and an additional circuit protection device communicatively coupled by a communications network is disclosed. The method includes transmitting, by each circuit protection device of the plurality of circuit protection devices, an electrical current communication to the communication network, the electrical current communication including an indication of an electrical current detected by the transmitting circuit protection device formatted according to a network communication protocol of the communication network. The additional circuit protection device receives the electrical current communications from the plurality of circuit protection devices and determines, based on the received electrical current communications, whether a ground fault condition exists in the electrical power distribution system.

DETAILED DESCRIPTION

Figure 1:
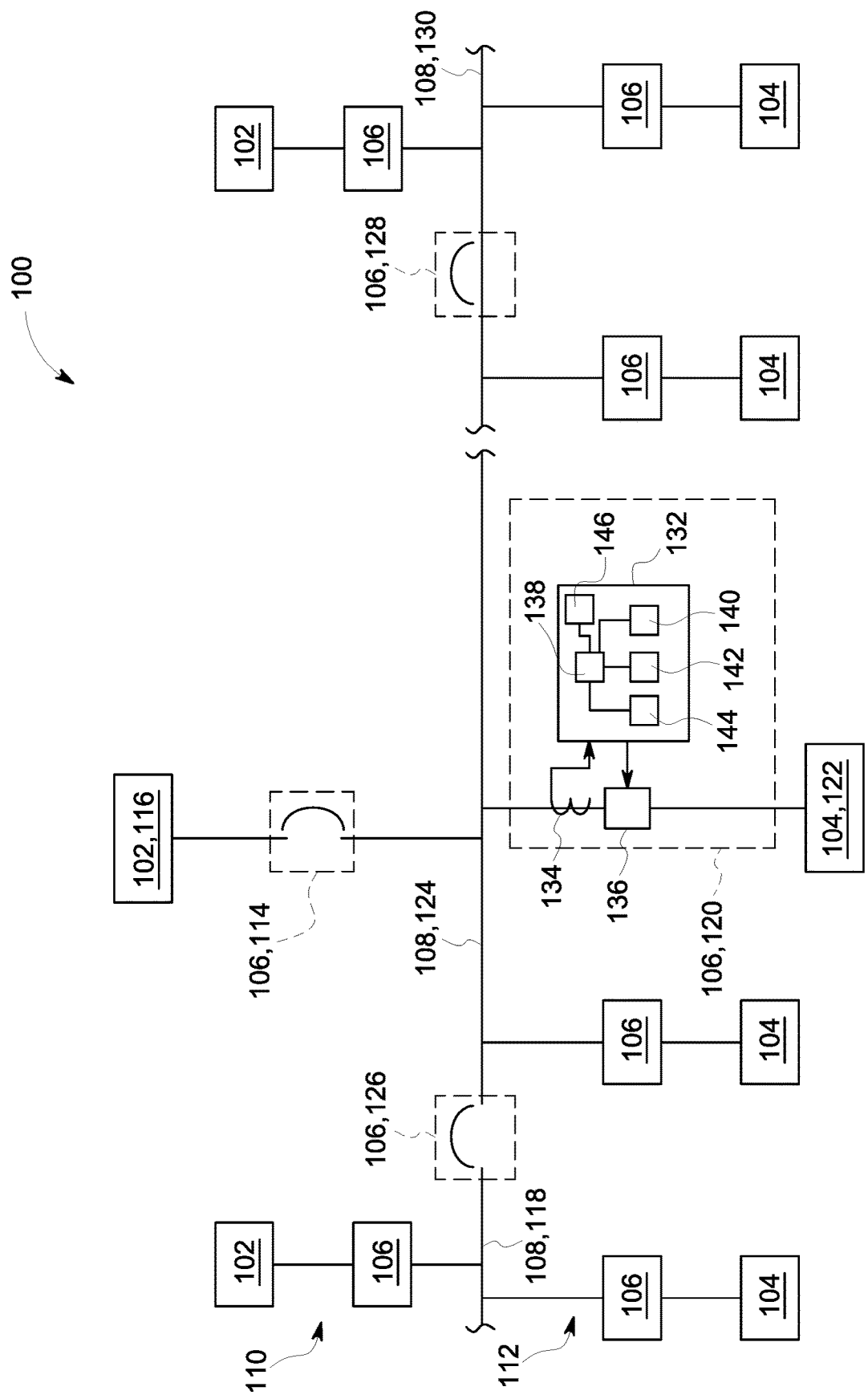
FIG. 1 is a schematic block diagram of an exemplary power distribution system.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Exemplary embodiments of power distribution systems and methods of operating power distribution systems are described herein. The exemplary power distribution systems include circuit protection devices organized in a wired and/or wireless communication network. The circuit protection devices are able to transmit circuit protection device data formatted in a communication protocol to each other in over the communication network to provide each circuit protection device with detail about the configuration, operation, and current status of the power distribution system and the circuit protection devices in the system. The shared information allows circuit protection device operation to be coordinated based on more complete information than some known systems.

FIG. 1 is a schematic block diagram of a portion of an exemplary electrical power distribution system 100 including sources 102 providing power to loads 104 via circuit protection devices 106. Electrical power sources 102 may include, for example, one or more generators, electrical grids, or other devices that provide electrical current (and resulting electrical power) to loads 104. The electrical current may be transmitted to loads 104 through distribution busses 108. Loads 104 may include, but are not limited to only including, machinery, motors, lighting, and/or other electrical and mechanical equipment of a manufacturing or power generation or distribution facility. Although connections between components in system 100 are illustrated with a single line for simplicity, it should be understood that system 100 will include multiple electrical connections between components, such as a line connection, a neutral connection, and a ground connection. Moreover, some embodiments are multiphase systems including a separate line connection for each phase of electricity.

In some embodiments, circuit protection devices 106 are housed in one or more switchgear units (not shown in FIG. 1). The switchgear units include racks to which circuit protection devices 106 are mounted within a cabinet. Circuit protection devices 106 that are electrically close to each other may be disposed physically close to each other, such as in the same switchgear unit, or physically distant from each other, such as in separate switchgear units, in separate rooms, etc. Similarly, circuit protection devices 106 that are electrically distant from each other may be disposed physically close to each other or physically distant from each other.

In the illustrated embodiment, circuit protection devices 106 are arranged in a hierarchy including a first tier 110 and a second tier 112 to provide different levels of protection and monitoring to power distribution system 100. For example, a first circuit protection device 114 (sometimes referred to as a source circuit protection device) is arranged in first tier 110 to receive current from a first electrical power source 116 and provide current to a first bus 118. A second circuit protection device 120 (sometimes referred to as a feeder circuit protections device) is arranged in the second tier 112 downstream of first circuit protection device 114 and connected to receive current from first bus 118. Second circuit protection device 120 provides current to a first load 122. As used herein, the term "downstream" refers to a direction from electrical power source 102 towards load 104. The term "upstream" refers to a direction opposite the downstream direction, for example, from load 104 towards electrical power source 102. While FIG. 1 illustrates circuit protection devices 106 arranged in two tiers 110 and 112, it should be recognized that any suitable number of circuit protection devices 106 may be arranged in any suitable number of tiers to enable power distribution system 100 to function as described herein. For example, it should be recognized that one or more additional tiers and/or circuit protection devices 106 may be disposed between electrical power source 102 and first tier 110 in some embodiments. Additionally or alternatively, one or more additional tiers and/or circuit protection devices 106 may be disposed between load 104 and second tier 112 circuit protection devices 106 in some embodiments.

The example system 100 includes three distribution busses 108 coupled together by two circuit protection devices 106 referred to as ties. First distribution bus 118 is connected to second distribution bus 124 by a first tie 126 (also referred to as a first tie circuit protection device). A second tie 128 (also referred to as a second tie circuit protection device) connects first distribution bus 118 to a third distribution bus 130. Although three busses are shown in FIG. 1, power system 100 may include any suitable number of busses, including more or fewer than three busses. First tie 126 and second tie 128 are sometimes referred to herein as source circuit protection devices that are connected between a source 102 (via distribution bus 124 or 130) and first distribution bus 118.

In the exemplary embodiment, circuit protection devices 106 are circuit breakers. Alternatively, circuit protection devices 106 may be any other device that enables power distribution system 100 to function as described herein. In an exemplary embodiment, each circuit protection device 106 in second tier 112 includes an integrated trip unit. Details of an example integrated trip unit are shown for second circuit protection device 120, and are omitted from other circuit protection devices 106 for clarity. Second circuit protection device 120 includes a trip unit 132 operatively coupled to a sensor 134 and a trip mechanism 136. Trip unit 132, in an exemplary embodiment, is an electronic trip unit (ETU) that includes a processor 138 coupled to a memory 140, an input device 142, a display device 144, and a network interface. In some embodiments, trip unit 132 does not include input device 142 and/or display device 144. Trip unit 132 may include, or may be considered to be, a computing device. In other embodiments, trip units 132 may be any other suitable type of trip unit. In some embodiments, one or more of circuit protection devices 106 include a different type of trip unit 132 and/or is a different type of circuit protection device than at least one other of circuit protection devices 106.

Sensor 134, in an exemplary embodiment, is a current sensor, such as a current transformer, a Rogowski coil, a Hall-effect sensor, a fiber optic current sensor, and/or a shunt that measures a current flowing through trip mechanism 136 and/or circuit protection device 106. Alternatively, sensor 134 may include any other sensor that enables power distribution system 100 to function as described herein. Moreover, sensor 134 may be integrated in a circuit protection device 106 or may be separate from an associated circuit protection device 106. Different sensors 134 may be used for different portions of system 100. For example, sensors 134 in first tier 110 may be different than sensors 134 in second tier 112. Each sensor 134 generates a signal representative of the measured or detected current (hereinafter referred to as "current signal") flowing through an associated trip mechanism 136 and/or circuit protection device 106. In addition, each sensor 134 transmits the current signal to processor 138 associated with, or coupled to, trip mechanism 136. Each processor 138 is programmed to activate trip mechanism 136 to interrupt a current provided to a load 104 or an electrical distribution line or bus 108 if the current signal, and/or the current represented by the current signal, exceeds a current threshold. Moreover, in some embodiments, processor 138 converts the current signal to the amount (i.e., the magnitude) of electrical current represented by the current signal. Thus, circuit protection devices 106 can send communication signals to other circuit protection devices 106 that include the amount of current detected rather than a value of the current signal. The receiving circuit protection devices 106 do not need to know what type of current sensor was used to measure the current, thereby permitting circuit protection devices 106 with different types of current sensors or different models of current sensors to be used in a single system. In other embodiments, circuit protection devices 106 send a value of the current signal and the receiving circuit protection devices 106 determine the amount of current represented by the current signal based on received data about the transmitting circuit protection device 106 (including the type of current sensor used by the transmitting circuit protection device 106).

In the example embodiment, trip mechanism 136 is a circuit breaker. An electric signal is provided to trip mechanism 136 to cause the circuit breaker to trip and interrupt the flow of current through trip mechanism 136. In other embodiments, trip mechanism 136 includes, for example, one or more other circuit breaker devices and/or arc containment devices. Exemplary circuit breaker devices include, for example, circuit switches, contact arms, and/or circuit interrupters that interrupt current flowing through the circuit breaker device to a load 104 coupled to the circuit breaker device. An exemplary arc containment device includes, for example, a containment assembly, a plurality of electrodes, a plasma gun, and a trigger circuit that causes the plasma gun to emit ablative plasma into a gap between the electrodes in order to divert energy into the containment assembly from an arc or other electrical fault that is detected on the circuit.

Each processor 138 controls the operation of a circuit protection device 106 and gathers measured operating condition data, such as data representative of a current measurement (also referred to herein as "current data"), from sensor 134 associated with a trip mechanism 136 coupled to processor 138. Processor 138 stores the current data in a memory 140 coupled to processor 138. It should be understood that the term "processor" refers generally to any programmable system including systems and microcontrollers, reduced instruction set circuits (RISC), application specific integrated circuits (ASIC), programmable logic circuits, and any other circuit or processor capable of executing the functions described herein. The above examples are exemplary only, and thus are not intended to limit in any way the definition and/or meaning of the term "processor." In the example embodiments described herein, processor 138 also controls network communication by its circuit protection device. In other embodiments, processor 138 handles protection operations and a separate processor (not shown) handles network communication.

Memory 140 stores program code and instructions, executable by processor 138, to control circuit protection device 106. Memory 140 may include, but is not limited to only include, non-volatile RAM (NVRAM), magnetic RAM (MRAM), ferroelectric RAM (FeRAM), read only memory (ROM), flash memory and/or Electrically Erasable Programmable Read Only Memory (EEPROM). Any other suitable magnetic, optical and/or semiconductor memory, by itself or in combination with other forms of memory, may be included in memory 140. Memory 140 may also be, or include, a detachable or removable memory, including, but not limited to, a suitable cartridge, disk, CD ROM, DVD or USB memory.

Input device 142 receives input from, for example, a user. Input device 142 may include, for example, a keyboard, a card reader (e.g., a smartcard reader), a pointing device, a mouse, a stylus, a touch sensitive panel (e.g., a touch pad or a touch screen), a gyroscope, an accelerometer, a position detector, a keypad, a communications port, one or more buttons, and/or an audio input interface. A single component, such as a touch screen, may function as both display device 144 and input device 142. Although a single input device 142 is shown, a trip unit 132 may include more than one input device 142 or no input device 142.

Display device 144 visually presents information about circuit protection device 106 and/or trip mechanism 136. Display devices 144 may include a vacuum fluorescent display (VFD), one or more light-emitting diodes (LEDs), liquid crystal displays (LCDs), cathode ray tubes (CRT), plasma displays, and/or any suitable visual output device capable of visually conveying information to a user. For example, processor 138 may activate one or more components of display device 144 to indicate that circuit protection device 106 and/or trip mechanism 136 is active and/or operating normally, is receiving a blocking signal, is transmitting a blocking signal, that a fault or failure has occurred, and/or any other status of trip mechanism 136 and/or circuit protection device 106. In some embodiments, display device 144 presents a graphical user interface (GUI) to a user for interaction between the user and circuit protection device 106. The GUI permits the user, for example, to control circuit protection device 106, monitor operation/status of circuit protection device 106, test operation of circuit protection device 106, and/or modify operational parameters of circuit protection device 106.

Network interfaces 146 allows circuit protection devices 106 to communicate with each other as well as remote devices and systems as part of a wired or wireless communication network. Wireless network interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Wash.; ZigBee is a registered trademark of the ZigBee Alliance of San Ramon, Calif.) Wired network interfaces may use any suitable wired communication protocol for direct communication including, without limitation, USB, RS232, I2C, SPI, analog, and proprietary I/O protocols. Moreover, in some embodiments, the wired network interfaces include a wired network adapter allowing the computing device to be coupled to a network, such as the Internet, a local area network (LAN), a wide area network (WAN), a mesh network, and/or any other network to communicate with remote devices and systems via the network. Circuit protection devices 106 transmit and receive communications over the communication network using messages formatted according to an appropriate network communication protocol. In some embodiments, the network communication protocol is an Ethernet communication protocol or an Institute of Electrical and Electronics Engineers (IEEE) 802.11 based communication protocol.

By communicatively coupling circuit protection devices 106 together in a communication network, circuit protection devices 106 are able to communicate detailed data to each other beyond simple binary commands. Moreover, the communication network allows circuit protection devices 106 to communicate with all circuit protection devices 106 communicatively coupled to the communication network. In various embodiments, circuit protection devices 106 are configured to transmit various types of circuit protection device data, such as measured electrical current, operating parameters and settings, intended actions, device identification data, maintenance status, error data, other sensor data, data received from other circuit protection devices, and the like, to the communication network for receipt by the other circuit protection device 106 coupled to the network. Circuit protection devices 106 are able to cooperate with each other to provide protection based on more complete data about the overall system than might otherwise be available in a power distribution system without a centralized controller.

Additionally, circuit protection devices are configured, such as by instructions stored in memory 140 and executed by processor 138, to be capable of communication with devices outside of power distribution system 100. Thus, a user may establish communication with circuit protection devices 106 using a remote access device (not shown in FIG. 1), such as a computer, a laptop computer, a tablet computer, a smartphone, a personal digital assistant (PDA), a dedicated power distribution system communication device, or the like. The remote access device can be used for any suitable purpose including, for example, reviewing and/or changing circuit protection device settings, monitoring operation of circuit protection devices 106, remotely controlling circuit protection device setting, initiating tests of circuit protection devices, and the like.

In various embodiments, as described in more detail below, circuit protection devices 106 are configured into a communication network according to any suitable network communication configuration. The communication network may be a wired network, a wireless network, or a combination of wired and wireless network. In some embodiments, circuit protection devices 106 communicate directly with each other circuit protection device 106 or remote access device within range of its communication signals. In some embodiments, circuit protection devices 106 communicate directly with one or more circuit protection devices 106 that act as network switches to direct communication between circuit protection devices 106 and any remote access devices. In some embodiments, circuit protection devices 106 are configured as a mesh network, while in some embodiments a network switch or router is included within or without the switchgear units of power distribution system 100. Two or more of above-described configurations, as well as any other suitable configurations, may be combined in power distribution system 100 in some embodiments.

FIGS. 2-7 are diagrams of several example communication configurations of power distribution system 100. In FIGS. 2-7 common reference numbers refer to similar components serving similar functions, unless otherwise noted. In each configuration, power distribution system 100 is disposed within switchgear unit 202 surrounded by an arc flash safety boundary 204. Although a single switchgear unit and four circuit protection devices 106 are illustrated, power distribution system 100 may include more or fewer circuit protection devices 106 and may be disposed in more than one switchgear unit in various embodiments of each communication configuration. Network communication between circuit protection devices in separate switchgear units may be wired or wireless communication.

Figure 2:
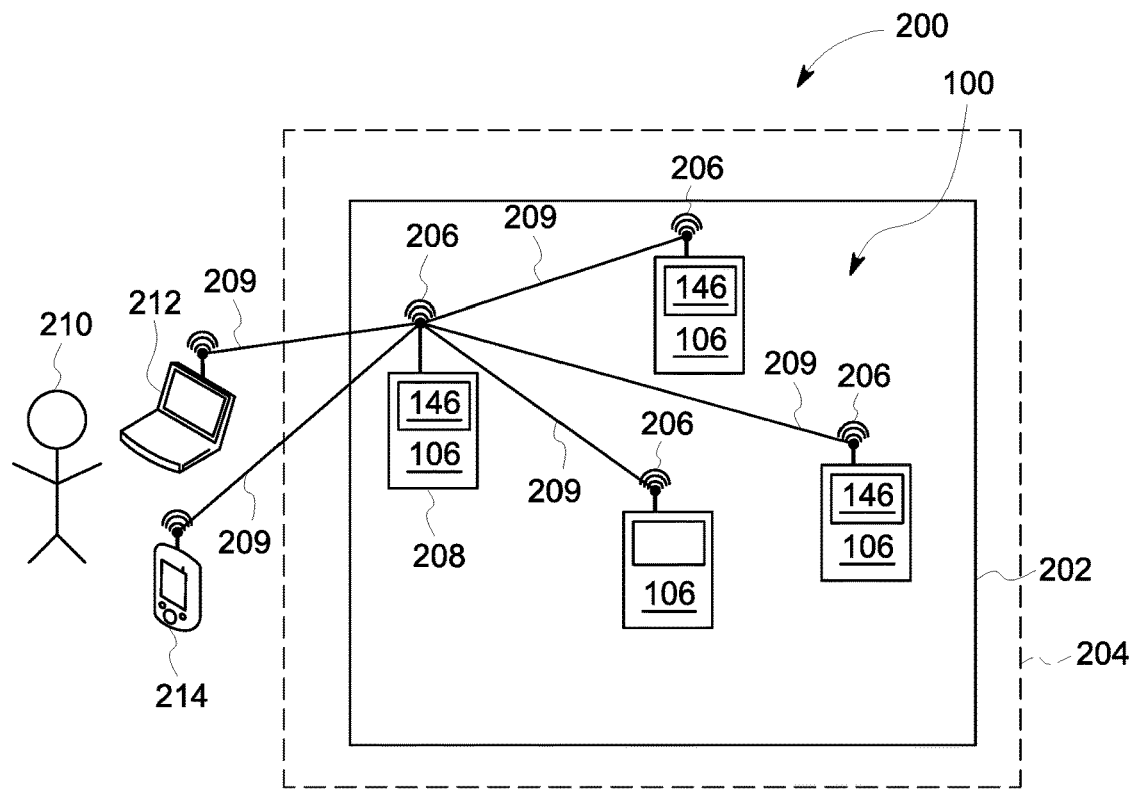
FIG. 2 is a diagram of a wireless communication configuration of the power distribution system shown in FIG. 1.

FIG. 2 is a diagram of a wireless communication configuration 200 of power distribution system 100. This configuration utilizes a single device as the wireless system's access point. Each circuit protection device's network interface 146 is a wireless network interface 146 connected to an antenna 206. A first circuit protection device 208 is configured to function as an access point for the communication network. In some embodiments, first circuit protection device may also communicatively couple the communication network to circuit protection devices 106 disposed in a separate switchgear unit. In the illustrated embodiment, each circuit protection device 106 is wirelessly, communicatively coupled to first circuit protection device 208 through wireless signals 209. Each circuit protection device 106 communicates to other devices coupled to the communication network through first circuit protection device 208. A user 210 may access the communication network, and accordingly circuit protection devices 106, using a remote communication device, such as laptop computer 212 or smartphone 214. Laptop 212 and smartphone 214 are wirelessly, communicatively coupled to the communication network through first circuit protection device 208.

Figure 3:
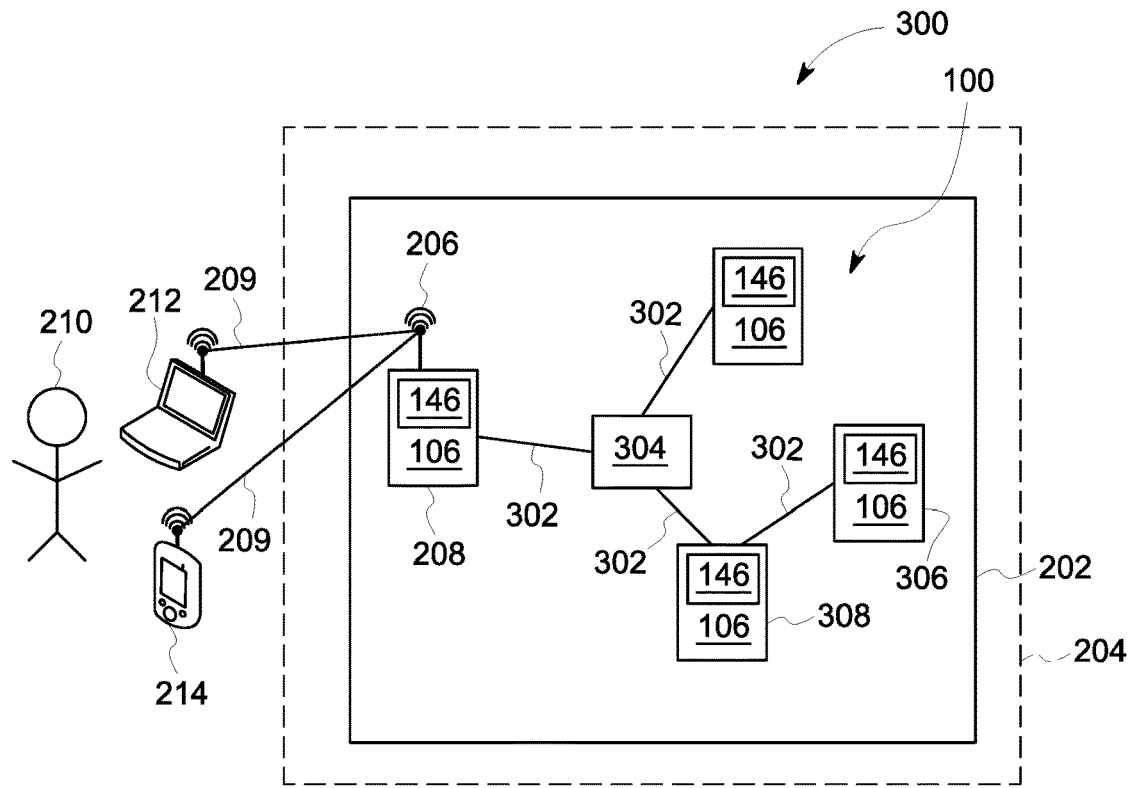
FIG. 3 is a diagram of a wired communication configuration of the power distribution system shown in FIG. 1 that also provides wireless access to a user.

FIG. 3 is a diagram of a wired communication configuration 300 that also provides wireless access to user 210. This configuration allows a user device to wirelessly connect to a wired system using a single device, with that device acting as an access point. Each circuit protection device's network interface 146 includes a wired network interface 146. Circuit protection devices 106 are connect by network cables 302 to a network switch 304 to form the communication network. Network interface 146 of first circuit protection device 208 also includes a wireless network interface 146. Although illustrated as a single network interface 146, first circuit protection device may include separate wireless and wired network interfaces 146. First circuit protection device 208 is configured to function as a network bridge (also referred to sometimes herein as an access point) to facilitate wireless access to the wired communication network. Generally, each circuit protection device 106 communicates to other devices coupled to the communication network through network switch 304. A second circuit protection device 306 is indirectly coupled to network switch 304 through a third circuit protection device 308. User 210 may access the communication network, and accordingly circuit protection devices 106, using a remote communication device wirelessly, communicatively coupled to the wired communication network through first circuit protection device 208.

Figure 4:
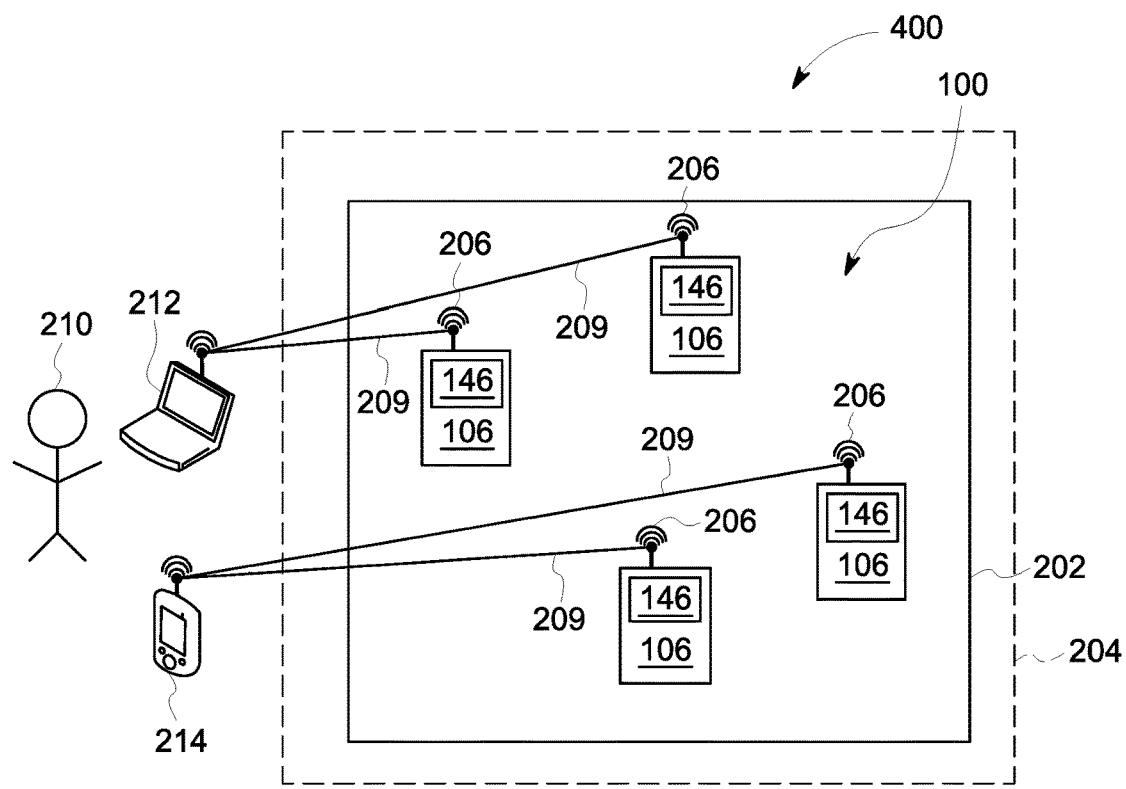
FIG. 4 is a diagram of another wireless communication configuration of the power distribution system shown in FIG. 1.

FIG. 4 is a diagram of another wireless communication configuration 400 of power distribution system 100. This configuration allows the user to connect wirelessly in a peer-to-peer fashion to any chosen device. Each circuit protection device's network interface 146 includes a wireless network interface 146. In this configuration, none of circuit protection devices 106 functions as an access point. Rather, each circuit protection device 106 wirelessly communicates directly with the intended communication destination, e.g., a peer-to-peer network. Direct wireless communication is also used for communication between circuit protection devices 106 and remote communication devices 212 and 214.

Figure 5:
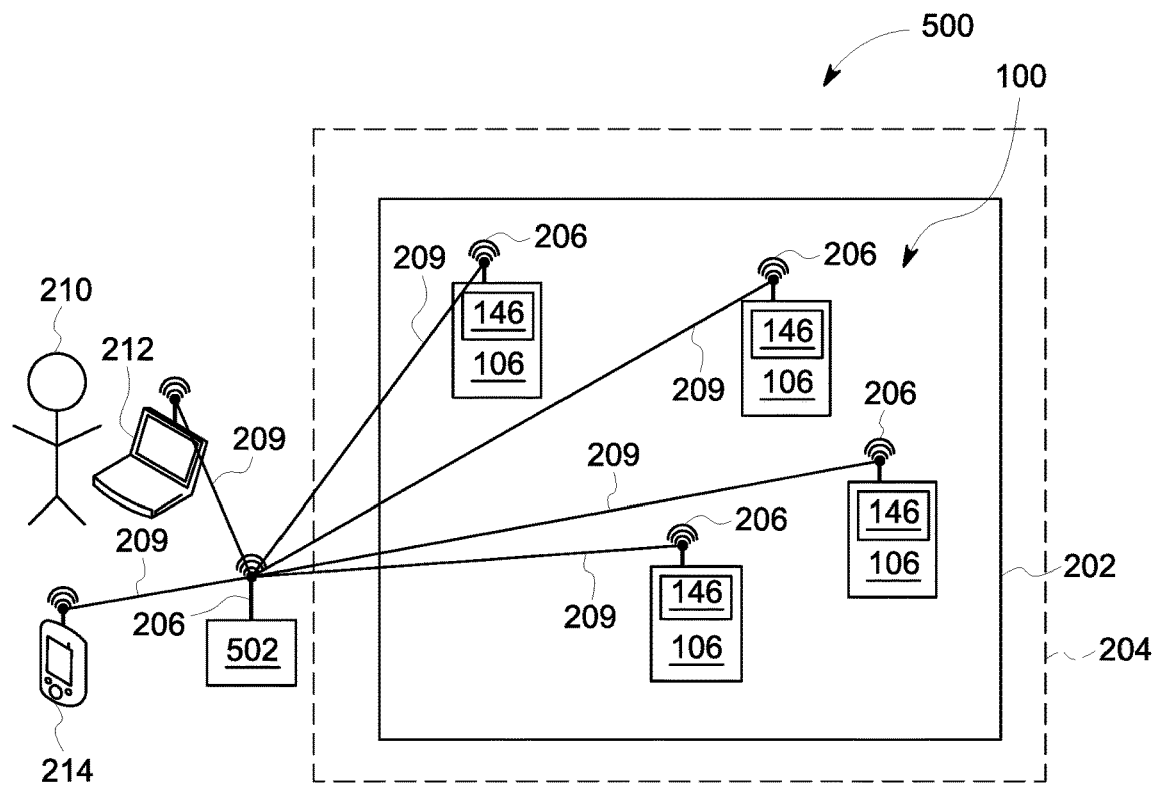
FIG. 5 is a diagram of another wireless communication configuration of the power distribution system shown in FIG. 1.

FIG. 5 is a diagram of a wireless communication configuration 500 in which a wireless access point 502 is disposed outside of switchgear unit 202. This configuration allows the user to connect to the system wirelessly using an external access point device. Circuit protection devices 106 and remote communication devices 212 and 214 are wirelessly, communicatively coupled to wireless access point 502. Network communication is transmitted wirelessly to wireless access point 502, which transmits the communication to its intended destination.

Figure 6:
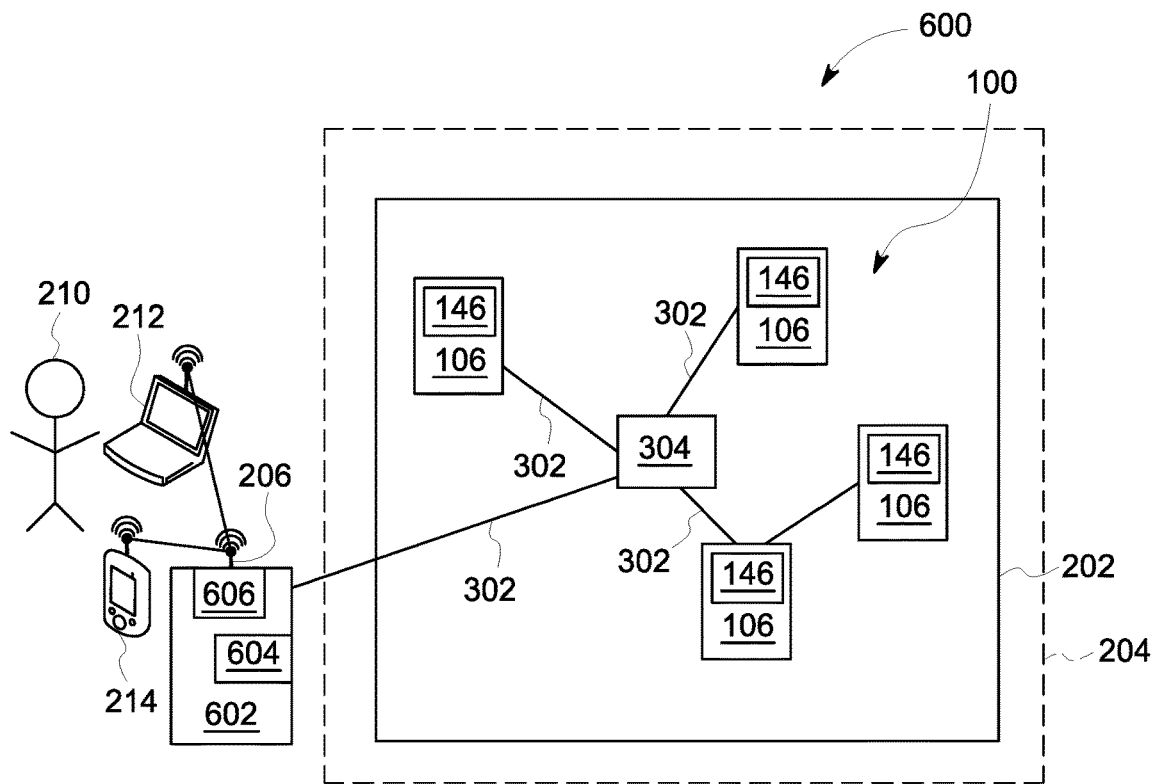
FIG. 6 is a diagram of another wired communication configuration of the power distribution system shown in FIG. 1 that also provides wireless access to a user.

FIG. 6 is a diagram of another wired communication configuration 600 that also provides wireless access to user 210. Each circuit protection device's network interface 146 includes a wired network interface 146. Circuit protection devices 106 are connect by network cables 302 to network switch 304 to form the communication network. An access point 602 is disposed outside of switchgear unit 202. Access point 602 includes a wired network interface 604 and a wireless network interface 606. Access point 602 is connected to network switch 304 by a network cable 302. Wireless network interface 606 provides wireless connectivity to remote communication devices 212 and 214.

Figure 7:
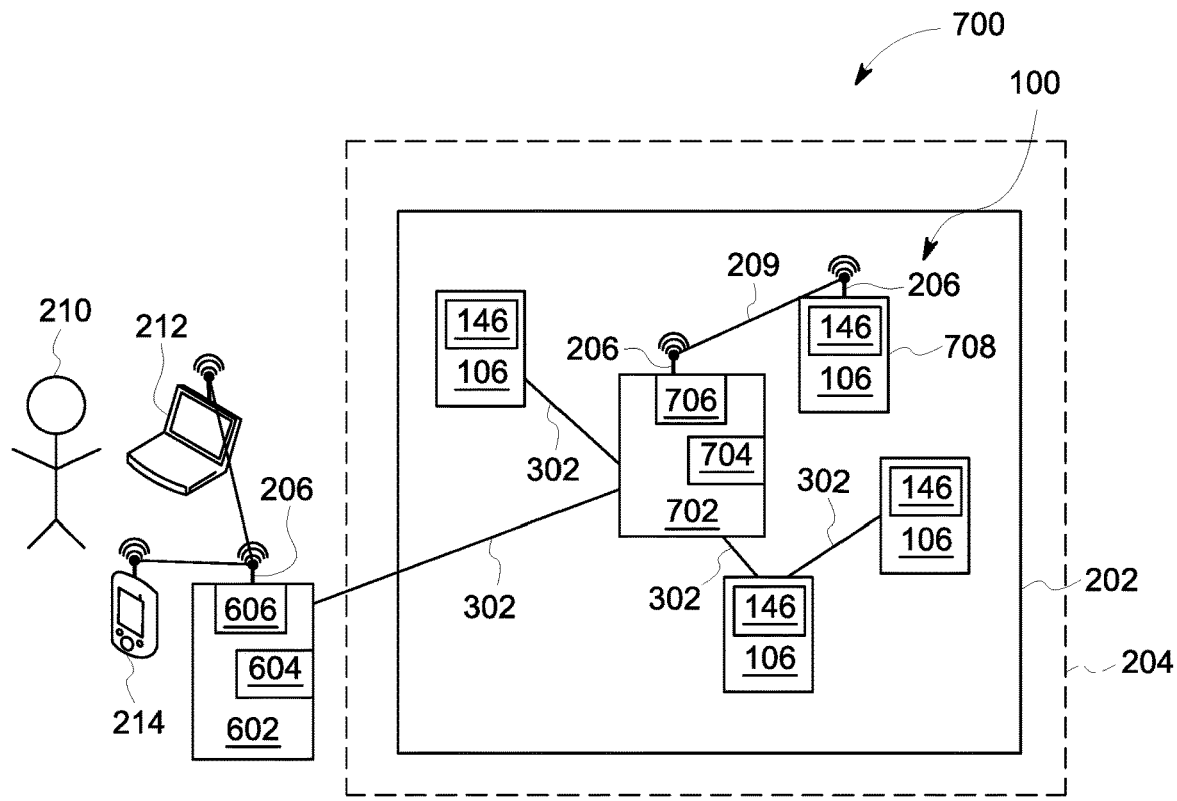
FIG. 7 is a diagram of a hybrid communication configuration of the power distribution system shown in FIG. 1 including wired and wireless communication within the power distribution system.

FIG. 7 is a diagram of a hybrid communication configuration 700 of power distribution system 100 including wired and wireless communication within power distribution system 100. An access point 702 is disposed within of switchgear unit 202. Access point 602 includes a wired network interface 704 for wired connection to circuit protection devices 106 and a wireless network interface 706 for wired connection to circuit protection devices 708. Access point 602 is connected to network switch 304 by a network cable 302. The wireless network interface of access point 602 provides wireless connectivity to remote communication devices 212 and 214.

The example communications configurations 200, 300, 400, 500, 600, and 700 may be combined in any suitable combination of wired and wireless connectivity across any number of circuit protection devices 106 disposed in one or more switchgear units 202.

Figure 8:
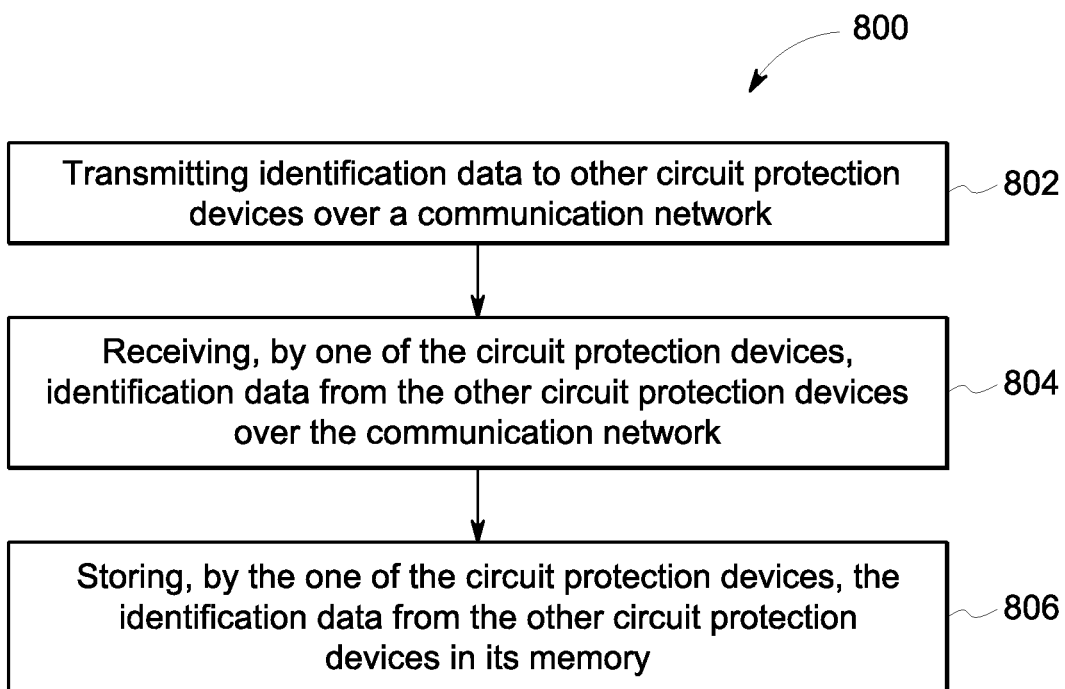
FIG. 8 is a flow diagram of an example method of operating an electrical power distribution system.

FIG. 8 is a flow diagram of an example method 800 of operating an electrical power distribution system, such as power distribution system 100, comprising a plurality of circuit protection devices coupled between an electrical power source and a plurality of electrical loads. Each circuit protection device of the plurality of circuit protection devices include a trip unit, a network interface communicatively coupled to a communication network including the plurality of circuit protection devices, a processor, and a memory.

At 802 one of the circuit protection devices transmits identification data to the other circuit protection devices of the plurality of circuit protection devices over the communication network. The identification data can include information such as a unique identifier of the transmitting circuit protection device, functional capabilities of the transmitting circuit protection device, identification of a load connected to the transmitting circuit protection device, an electrical position (e.g., upstream/downstream) of the transmitting circuit protection device, what type of device that the transmitting circuit protection device is, and/or operational settings of the transmitting circuit protection device. The one of the circuit protection devices receives, at 804, identification data from the other circuit protection devices of the plurality of circuit protection devices over the communication network. At 806, the one of the circuit protection devices stores the identification data from the other circuit protection devices in its memory. In some embodiments, the receiving circuit protection device determines an approximation of its physical proximity to the other circuit protection and stores the approximation in its memory.

Connecting circuit protection devices 106 in a communication network in system 100 permits a significant amount of information to be communicated between circuit protection devices 106. This information enables circuit protection devices 106 to operate based on a more complete picture of the overall operation and conditions of power distribution system 100. In the example embodiment, for example, circuit protection devices 106 are enabled to perform intelligent zone selective interlocking (ZSI) based on data beyond a simple ZSI restraining signal. In some embodiments, circuit protection devices 106 do not output a ZSI restraining/blocking signal.

Generally, circuit protection devices, such as circuit protection device 106, use ZSI to prevent upstream circuit protection device 106 from tripping due to an excessive current (or other fault condition) when a downstream circuit protection device 106 has detected the current and should trip to interrupt the electrical current. The ZSI threshold is typically less than the tripping threshold at which the downstream circuit protection device 106 trips. In response to receiving a blocking signal, the upstream circuit protection device 106 may shift from an unrestrained mode of operation to a restrained mode of operation, to prevent the upstream and downstream circuit protection devices 106 from operating at similar trip timing sequences. Additionally or alternatively, the upstream circuit protection device 106 may switch to operating at, or using, a higher trip threshold, such as switching from a protective threshold to a backup threshold, in response to receiving a blocking signal from a downstream circuit protection device 106.

In some embodiments, in an unrestrained mode of operation, an unrestrained trip timing sequence may be executed that includes accumulating time values in which the current exceeds the protective threshold until an unrestrained time threshold is reached. In the restrained mode of operation, a restrained trip timing sequence may be executed that includes accumulating time values in which the current exceeds the backup threshold until a restrained time threshold is reached. If the restrained time threshold or the unrestrained time threshold is reached, circuit protection device 106 trips. Alternatively, the unrestrained trip timing sequence and the restrained trip timing sequence may include any other actions or responses that enable circuit protection devices 106 to function as described herein. It should be recognized that the unrestrained trip timing sequence causes a trip signal to be generated in a period of time that is shorter than a period of time in which the restrained trip timing sequence causes a trip signal to be generated.

The restrained mode of operation may reduce the risk of an upstream circuit protection device 106 tripping before a downstream circuit protection device during a downstream fault, also referred to as a "nuisance trip". If the upstream circuit protection device 106 trips before the downstream circuit protection device 106, other downstream circuit protection devices 106 coupled to the upstream circuit protection device 106 are interrupted and current will not flow to any loads coupled to such downstream circuit protection devices 106.

In the example embodiment, when a circuit protection device's monitored electrical current exceeds a ZSI threshold (also referred to sometimes as a "blocking threshold"), the circuit protection device 106 sends ZSI data formatted according to the appropriate communication protocol to other circuit protection devices 106 over the communication network. In some embodiments, circuit protection device 106 transmits the ZSI data to all other circuit protection devices 106 in system 100. In other embodiments, each circuit protection device 106 knows its hierarchical relationship to the other circuit protection devices 106 transmits the ZSI data only to those circuit protection devices 106 located upstream from the transmitting circuit protection device 106.

In the example embodiment, the ZSI data includes at least an identification of which circuit protection device 106 is transmitting the ZSI data and an indication that the transmitting circuit protection device 106 has detected a current exceeding its ZSI threshold. In some embodiments, the ZSI data also includes an amount of electrical current sensed by the transmitting circuit protection device 106. In other embodiments, the ZSI data includes a value of the current signal measured by the transmitting circuit protection device's current sensor, which the receiving circuit protection device 106 converts to an amount of current based on data about the transmitting circuit protection device 106. The ZSI data may also include an indication of the location of the transmitting circuit protection device 106 within system 100. For example, the location indication may include a level within the hierarchy of system 100, and/or an identification (such as a name, load type, identification number, etc.) of which load 104 is served by the transmitting circuit protection device 106. In some embodiments, the ZSI data includes an operational mode in which the transmitting circuit protection device 106 is currently operating. The operational mode may be one of a plurality of operational modes stored in memory 140. Each operational mode will typically include one or more settings, such as pickup thresholds, calibration factors, and the like. Example operational modes include a standard mode, a restrained mode, and a maintenance mode. In some embodiments, the ZSI data includes identification of one or more specific settings currently active in the transmitting circuit protection device 106. ZSI data may also include an intended action to be taken by the transmitting circuit protection device 106. For example, the ZSI data may include an indication that the transmitting circuit protection device 106 intends to trip immediately, intends to trip if the present electrical current remains the same for a specified time, intends to trip according to a particular predefined setting, intends to trip immediately if the electrical current increases above the present value, etc. In some embodiments, the ZSI data includes a percentage of the trip threshold of the transmitting circuit protection device, an expected/predicted time to trip or clear a detected fault, a type of pickup (e.g., a ground fault or a short time), or any other data suitable for use in a zone selective interlocking system.

In the example embodiment, each circuit protection device 106 receives operational data (sometimes referred to herein as "additional data") from all or a portion of the other circuit protection devices 106 in system 100. The additional data can include electrical currents sensed by the other circuit protection devices 106, the present status and operational modes of the other circuit protection devices 106, the location of the other circuit protection devices within the hierarchy of system 100, temperature measurements from other circuit protection devices 106, etc. Accordingly, when a circuit protection device 106 receives ZSI data from another circuit protection device 106, the receiving circuit protection device 106 is able to determine how to react to the ZSI data based on the ZSI data, its own operational data (e.g., its sensor data and present operational mode), and additional data received from other circuit protection device 106 rather than slavishly responding to a ZSI blocking signal.

Thus, for example, if an upstream circuit protection device 106 receives ZSI data from a downstream circuit protection device 106, the upstream circuit protection device 106 may analyze the ZSI data, the current that the upstream circuit protection device 106 is sensing, the currents sensed by other circuit protection devices 106 as presented in the additional data, and any other relevant additional data to determine whether the potential problem detected by the downstream circuit protection device 106 is the only problem in system 100 and whether or not the transmitting downstream circuit protection device 106 is capable of satisfactorily handling the potential problem. If the upstream circuit protection device 106 determines that the downstream circuit protection device 106 is able to handle the problem and there are no other problems, the upstream circuit protection device 106 may switch to a restrained mode of operation. Alternatively, if the upstream circuit protection device 106 determines that there may be another problem with system 100, such as by detecting an electrical current larger than should be seen based on the ZSI data and the additional data, the upstream circuit protection device 106 may decline to switch to the restrained operational mode. Instead, the upstream circuit protection device 106 may remain in its current operational mode, immediately trip, switch to a more sensitive (e.g., quicker tripping) operational mode, or take any other suitable action. Similarly, if the upstream circuit protection device 106 receives ZSI data from more than one downstream circuit protection device 106 within a relatively small period of time, the upstream circuit protection device 106 may decline to switch to the restrained operational mode and may remain in its current operational mode, immediately trip, switch to a more sensitive operational mode, or take any other suitable action. Moreover, the upstream circuit protection device 106 may check the relative positions of the two ZSI transmitting circuit protection devices 106 before acting on the ZSI data. If, for example, the two ZSI transmitting circuit protection devices 106 are serving the same load, the upstream circuit protection device 106 may determine to switch to the restrained operational mode, if it does not detect any other problems with system 100.

In some embodiments, the circuit protection device 106 has more options for how to respond to received ZSI data than would typically be found in many known systems. As mentioned above, the receiving circuit protection device 106 may remain in its present operational mode, switch to the restrained mode, immediately trip, or switch to some other operational mode. Additionally, there may be multiple levels of operational modes that are generally categorized under a heading of standard or restrained. For example, a circuit protection device 106 may have multiple restrained operational modes, each of which is more restrained than the standard mode, but each of which has somewhat different characteristics from each other restrained mode. Thus, the circuit protection device 106 can provide a response more finely tuned to the particular circumstances and/or the particular conditions of system 100 as a whole than would be available if the only options were standard and restrained modes. In embodiments in which circuit protection devices 106 transmit predicted time to trip or clear a fault as part of the ZSI data, the circuit protection device 106 that receives the ZSI data may adjust how long it remains in a restrained operation mode based the predicted time to trip. Similarly, when the type of pickup is part of the ZSI data, the receiving circuit protection device 106 may determine not to switch to the restrained operation mode if detected fault types do not match.

After a circuit protection device 106 receives ZSI data from another circuit protection device 106 and determines how to react to the received ZSI data, the receiving circuit protection device 106, in some embodiments, sends a communication to one or more of circuit protection devices 106. The communication may include its intended action, its present operational mode, the electrical current it is currently sensing, or any other relevant information. Moreover, the receiving circuit protection device 106 may retransmit the ZSI data to other circuit protection devices 106 that may not have received the ZSI data from the original source.

Figure 9:
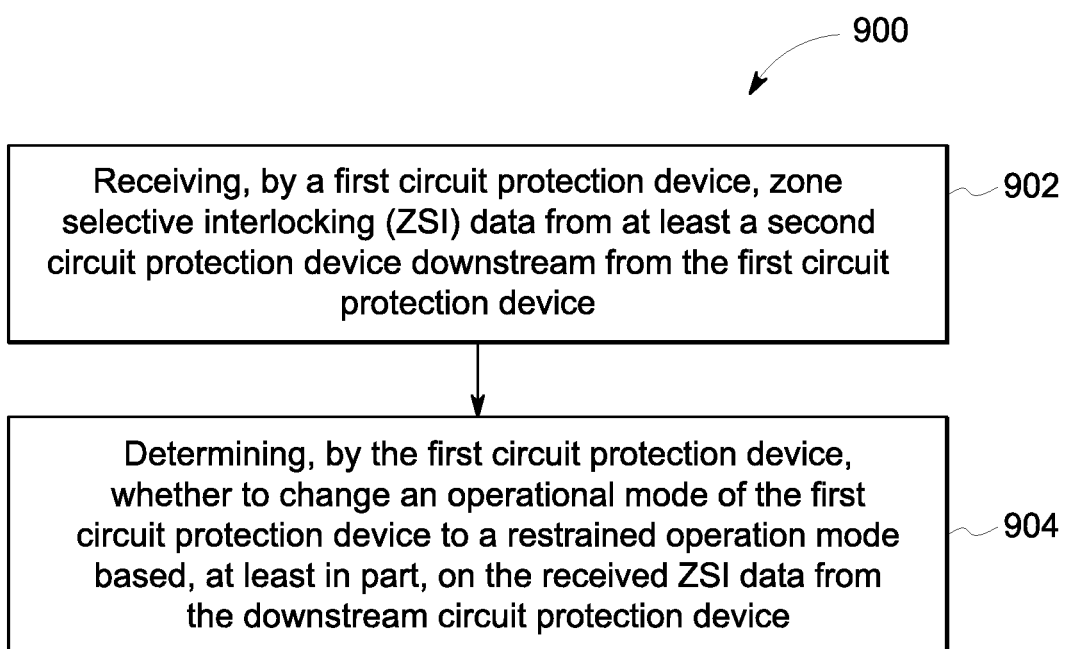
FIG. 9 is a flow diagram of another example method of operating an electrical power distribution system.

FIG. 9 is a flow diagram of an example method 900 of operating an electrical power distribution system. The electrical power distribution system includes a plurality of circuit protection devices coupled between an electrical power source and a plurality of electrical loads. Each circuit protection device of the plurality of circuit protection devices comprising a network interface communicatively coupled to a communication network including the plurality of circuit protection devices, a processor, and a memory device. For convenience, method 900 will be discussed with reference to system 100 and the components of system 100 (all shown in FIG. 1). It should be understood, however, that method 900 may be used with any other suitable electrical power distribution system.

The method 900 includes receiving, by a first circuit protection device 114 of the plurality of circuit protection devices 106, zone selective interlocking (ZSI) data from at least a second circuit protection device 120 downstream from the first circuit protection device 114. The ZSI data is formatted according to a network communication protocol of the communication network.

At 904, first circuit protection device 114 determines whether to change an operational mode of the first circuit protection device 114 to a restrained operational mode based, at least in part, on the received ZSI data from downstream circuit protection device 120.

In some embodiments, of circuit protection devices 106 coordinate to provide maintenance mode protection in system 100. Generally, when a maintenance mode operational setting of one circuit protection device 106 is enabled (i.e. its operational mode is switched from its present mode to the maintenance mode), all circuit protection devices 106 that are located physically close to the maintenance mode enabled circuit protection device 106 also switch to a maintenance mode operational setting.

To accomplish coordinated maintenance mode protection, circuit protection devices 106 are configure, such as by instructions stored in memory 140, to determine the physical distance between circuit protection devices 106. The physical distance represents how close circuit protection devices 106 are physically located to each other, rather than the electrical relationship between circuit protection devices 106. While circuit protection devices 106 that are electrically close may also be physically close, it is not required. Circuit protection devices 106 that are electrically distant (or even unrelated) may be housed in a same switchgear unit. Conversely, circuit protection devices 106 that are electrically close, such as circuit protection devices 106 fed by a same feeder circuit protection devices 106 may be disposed in separate switchgear units.

In the example embodiment, the physical distance of a circuit protection device 106 from another circuit protection device is determined based at least in part on a characteristic of a network communication signal sent by one of the two circuit protection devices 106 and received by the other circuit protection device 106. The characteristic can be any suitable characteristic of the network communication signal for which can be analyzed to determine an approximation of the physical distance that the network communication signal was sent. The approximation of the distance the signal was sent is used as an approximation of the distance between the sending and receiving circuit protection devices 106.

For example, if a network communication signal is transmitted wirelessly between two circuit protection devices 106, the wireless signal strength of the network communication signal received by a second of the circuit protection devices 106 from a first of the circuit protection devices 106 may be used to determine an approximation of the distance between the first of the circuit protection devices 106 and the second of the circuit protection devices. By comparison of the signal strength of the received network communication signal to the actual or predicted signal strength of the network communication signal when transmitted, the approximate distance between the circuit protection devices 106 may be estimated. The signal strength may be converted to an approximate distance measurement, converted to a percentage, and/or used without conversion. Similarly, in a wired network configuration of system 100, the attenuation of the wired network communication signal may be used to determine an approximation of the distance between transmitting and receiving circuit protection devices 106.

In the example embodiment, the physical locations of circuit protection devices 106 relative to each other are initially mapped by circuit protection devices 106 when system 100 is installed. In some embodiments, the physical locations of circuit protection devices 106 relative to each other are mapped by circuit protection devices 106 periodically (e.g., every time a network communication is received, daily, weekly, monthly, on demand, etc.). In some embodiments the physical locations of circuit protection devices 106 relative to each other are mapped by circuit protection devices 106 upon occurrence of a triggering event, such as upon receipt of a message indicating a maintenance mode is enabled for a circuit protection device 106.

Each circuit protection device 106 stores an indication of its approximate distance from each other circuit protection device 106 in its memory 140. The indication may be a computed distance, a signal attenuation level, one or more groupings of circuit protection devices 106 by relative degrees of closeness, or any other data suitable for indicating a degree of closeness of circuit protection devices 106 to each other. For example, all circuit protection devices 106 that are less than a first threshold distance away (or that have a signal strength greater than a threshold value) may be identified in a first group and the remaining circuit protection devices 106 may be identified in a second group. The first group are circuit protection devices 106 that are physically close, while the second group includes circuit protection devices 106 that are more distant. Of course, more than two groups and more than one threshold may be used to group circuit protection device 106.

When maintenance is to be performed on or in the vicinity of a circuit protection device 106, that circuit protection device is typically place in a maintenance mode. In the maintenance mode, the circuit protection device's settings are adjusted to make it more sensitive to undesired current levels and, if possible, decrease the amount of time needed to react to an undesired current level. Thus, circuit protection device 106 is easier and/or quicker to trip when the maintenance mode is enabled. In some embodiments, maintenance mode is enabled by a user manually enabling the maintenance mode, such as using a switch, a button, a user interface on or near the circuit protection device 106, or using a remote communication device, such as laptop computer 212 or smartphone 214.

In other embodiments, maintenance mode is automatically enabled for one or more circuit protection devices 106. Maintenance mode may be automatically enabled based on one or more sensors detecting a human body within a predefined proximity of one of circuit protection devices 106.

Figure 10:
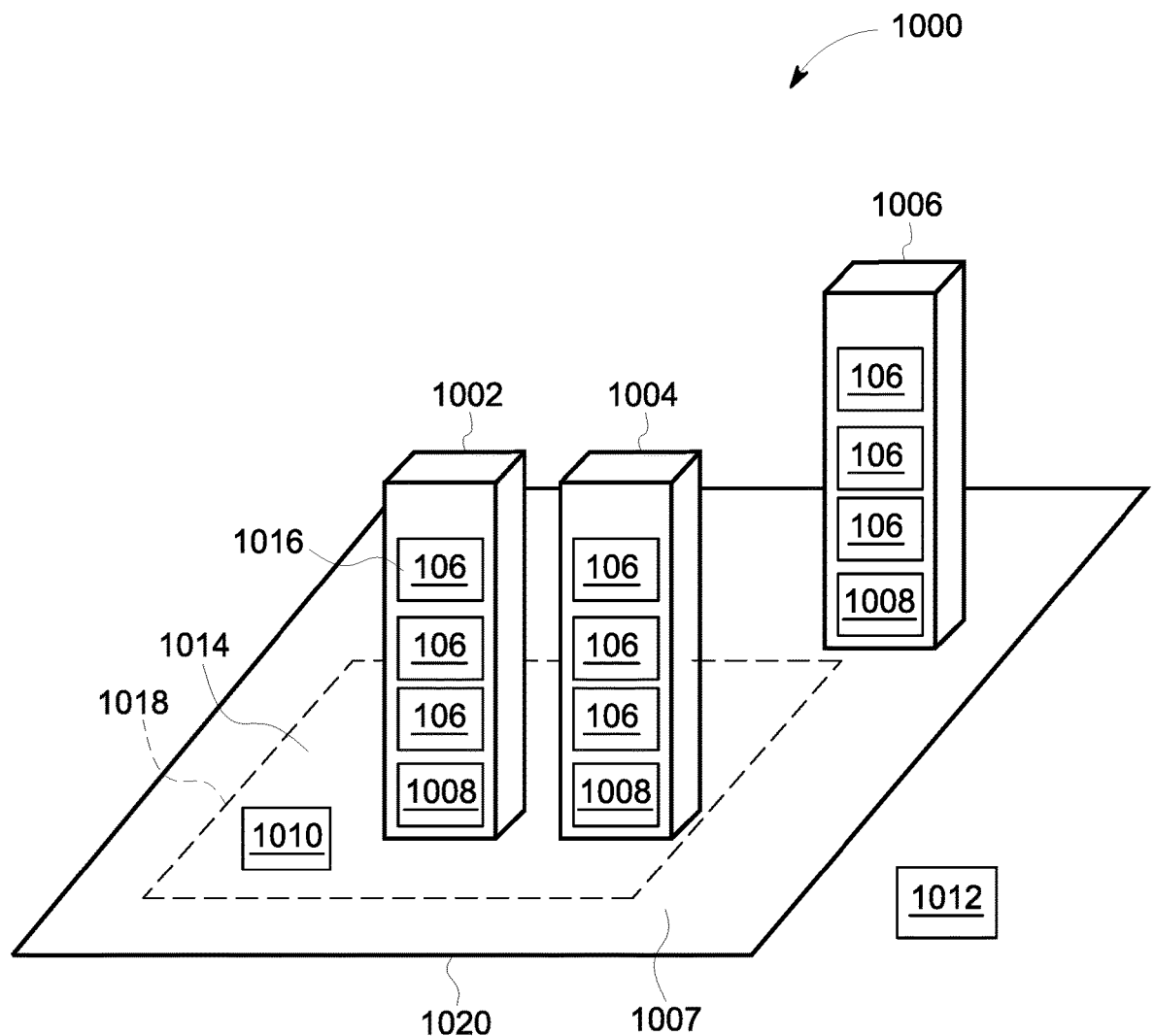
FIG. 10 is an example configuration of a portion of the power distribution system shown in FIG. 1.

FIG. 10 is a simplified diagram of a portion 1000 of system 100 configured for use with manual and/or automatic maintenance mode enablement combined with coordinated maintenance mode protection. In this embodiment, circuit protection devices 106 are disposed in switchgear units 1002, 1004, and 1006 in a room 1007. Sensors 1008, 1010, and 1012 are configured to detect the location of a body relative to switchgear units 1002, 1004, and 1006. Sensors 1008 detect when an operator is accessing circuit protection devices 106 and/or an interior of switchgear unit 1002, 1004, and 1006. The sensors 1008, 1010, and 1012 may be motion detectors, pressure sensors, thermal sensors, door sensors, or any other suitable sensor for detecting when a body may be near circuit protection devices 106 and/or preparing to access circuit protection devices 106. Sensor 1008 may be, for example, door sensors that detect when doors (not shown) to the interior of switchgear units 1002, 1004, and 1006 are opened. Additionally, or alternatively, sensors 1008 may be sensor within switchgear units 1002, 1004, and 1006 that detect access or movement of circuit protection devices 106. Sensor 1012 detects when a body is entering room 1007 and may be, for example a door sensor attached to a door (not shown) that provides access to room 1007. Sensor 1010 detects when a body is located within an arc flash zone 1014. Arc flash zone 1014 is defined around switchgear unit 1002. For clarity, the arc flash zones that would be defined around switchgear units 1004 and 1006 are not shown. Generally, arc flash zones 1014 are zones in which there may be a risk of injury to a body located in the zone if an arc flash occurred in the switchgear unit that defines the zone. Moreover, in some embodiments, maintenance mode may be automatically enabled for a circuit protection device based on detection of a user's remote communication device in proximity to that circuit protection device 106. For example, if a user's laptop computer 212 wirelessly connects to a circuit protection device 106 using a relatively short-range communication protocol, maintenance mode may be enabled for that circuit protection device 106. Maintenance mode may, additionally or alternatively, be manually enabled by an operator.

Whether automatically or manually enabled, when a circuit protection device 106, such as a first circuit protection device 1016, is switched to the maintenance mode, the other circuit protection devices 106 selectively switch to maintenance mode based at least in part on proximity to the maintenance mode enabled circuit protection device 106 and the maintenance status of first circuit protection device 1016. In some embodiments, the other circuit protection devices 106 detect the maintenance status of first circuit protection device. In other embodiments, the other circuit protection devices receive a maintenance status message from first circuit protection device 1016 through the communication network. The maintenance status message is transmitted to all circuit protection devices communicatively coupled to the communication network of system 100. Alternatively, the maintenance status message may be transmitted to a subset of all circuit protection devices 106. The subset includes only those circuit protection devices that are less than a threshold distance away from first circuit protection device 1016.

However the maintenance status of circuit protection device is detected by the other circuit protection devices 106, they determine whether or not to switch to the maintenance mode based in part on their distance from first circuit protection device 1016. In embodiments in which the maintenance message is transmitted only to the subset of circuit protection devices 106 that are less than the threshold distance from first circuit protection device 1016, all circuit protection devices 106 that receive the message know they are close to first circuit protection device 1016 without any additional analysis being needed. In embodiments in which circuit protection devices 106 detect the maintenance status of first circuit protection device 1016 or in which all circuit protection devices 106 receive the maintenance message, each circuit protection device 106 determines how close it is to first circuit protection device 1016. More particularly, each circuit protection device 106 determines if it is less than the threshold distance from first circuit protection device 1016. The determination may be made based on a characteristic of the maintenance message, a characteristic of previous data messages received from first circuit protection device 1016, previously provided distance data, data contained in the maintenance message, or based on any other suitable method.

In the example embodiment, the threshold distance is a distance from first circuit protection device 1016 to a boundary 1018 of arc flash zone 1014. Thus, any circuit protection device 106 within arc flash zone 1014 is also within the threshold distance from first circuit protection device 1016. In FIG. 10, circuit protection devices 106 within switchgear units 1002 and 1004 are within arc flash zone 1014 and less than the threshold distance from first circuit protection device 1016. Circuit protection devices 106 in switchgear unit 1006 are outside arc flash zone 1018 and their distance from first circuit protection device 1016 equals or exceeds the threshold distance. In other embodiments, the threshold distance may be any other suitable threshold distance. For example, the threshold distance may be based on a size of room 1007, such that all circuit protection devices 106 within room 1007 are less than the threshold distance from all other circuit protection devices in room 1007. In such an embodiment, circuit protection devices 106 outside of room 1007 would not be less than the threshold distance from circuit protection devices 106 within room 1007.

Upon determining, by whichever method, that the first circuit protection device's maintenance status includes being switched to maintenance mode, the particular circuit protection devices 106 that are spaced from first circuit protection device 1016 by less than the threshold distance selectively enable their own maintenance mode. In the example embodiment, circuit protection devices 106 that determine they are spaced from first circuit protection device 1016 by less than the threshold distance will enable their maintenance mode in response to the detection of first circuit protection device 1016 having its maintenance mode enabled. Because circuit protection device 106 are communicatively coupled together and receive operational data from multiple circuit protection devices 106, one or more circuit protection device may determine, in some embodiments, not to enable its protection mode due to some other condition in system 100 that takes precedence over switching to the maintenance mode. Similarly, one or more circuit protection device may determine, based on a condition that exists in system 100, to trip in response rather than switching to the maintenance mode.

Circuit protection devices 106 that are further away from first circuit protection device 1016 than the threshold distance continue to operate according to their present operating mode after determining that first circuit protection device 1016 has had its maintenance mode enabled. In some embodiments, such distant circuit protection devices 106 may alter their settings to a somewhat more sensitive setting, enable their maintenance operation modes, or take any other suitable protective action based on first circuit protection device 1016 being in maintenance operation mode and, for example, detection of some other condition in system 100 that indicates extra caution/protection may be desired.

Moreover, in some embodiments, one or more non-circuit breaker circuit protection devices (not shown) in system 100 may be enabled in response to maintenance mode enablement of first circuit protection device 1016. For example, an arc flash containment device near first circuit protection device 1016 may be enabled in response to receiving a maintenance message from first circuit protection device 1016. Alternatively, another of circuit protection devices 106 may instruct the arc flash containment device to enable itself when that circuit protection device determines that first circuit protection device 1016 is operating in the maintenance mode.

In some embodiments, multiple threshold distances defining multiple zones of proximity to first circuit protection device 1016 may be used. Different actions may be taken based at least in part on in which zone of proximity to first circuit protection device 1016 a particular circuit protection device 106 is located. In FIG. 10, for example, the distance from first circuit protection device 1016 to boundary 1018 may define a first threshold distance, while a distance from first circuit protection device 1016 to a boundary 1020 (e.g., a wall) of room 1007 may be used as a second threshold distance. The first threshold distance defines the arc flash zone around first circuit protection device 1016 and the second threshold distance approximately defines an in-room zone around first circuit protection device 1016. In multiple threshold embodiments, circuit protection devices 106 may take different actions based on which zone each circuit protection device 106 is located within. For example, circuit protection devices 106 in switchgear units 1002 and 1004 are closer than the first threshold distance (i.e., within arc flash zone 1014) and switch to their maintenance mode. The distance between circuit protection devices 106 in switchgear unit 1006 and first circuit protection device 1016 is less than the second threshold distance but greater than or equal to the first threshold distance (i.e., they are within room 1007, but not within arc flash zone 1014). Accordingly, circuit protection devices 106 in switchgear unit 1006 may switch to an operational mode that is more sensitive/faster than their standard operational setting, but less sensitive/slower than the maintenance mode that is enabled on circuit protection devices 106 in switchgear units 1002 and 1004.

Figure 11:
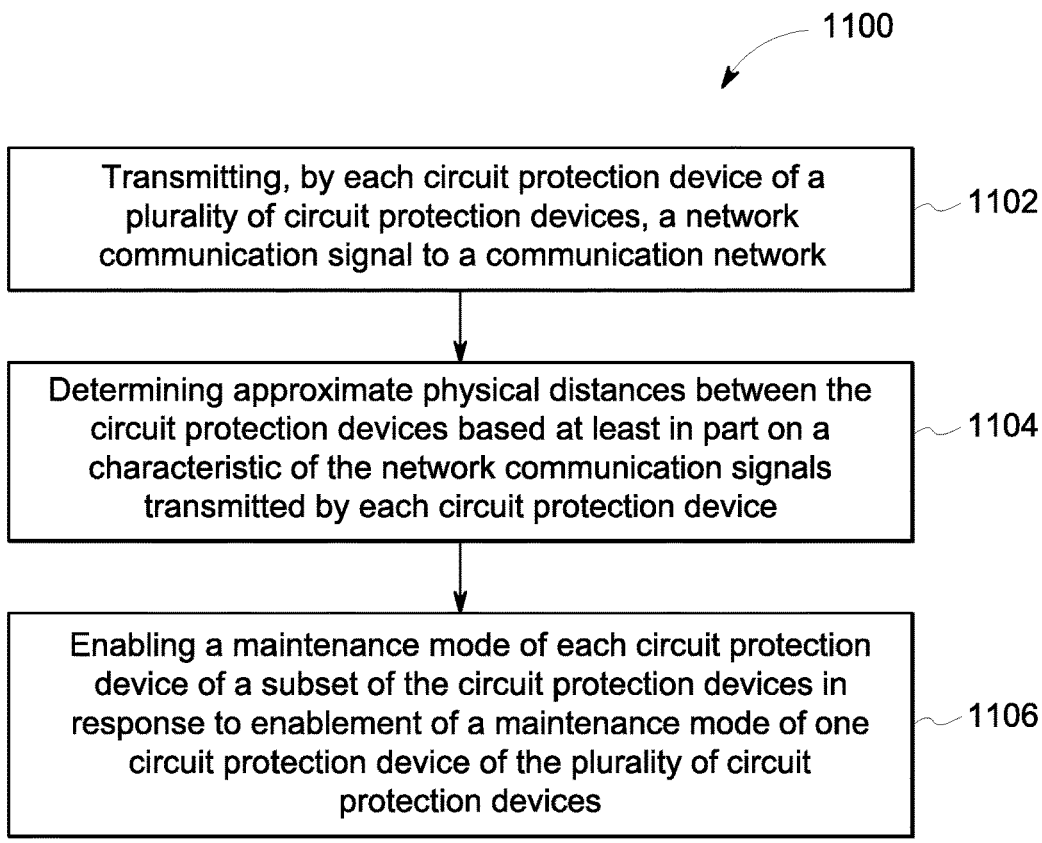
FIG. 11 is a flow diagram of an example method of coordinated maintenance mode operation of an electrical power distribution system.

FIG. 11 is a flow diagram of an example method 1100 of coordinating maintenance modes in an electrical power distribution system, such as system 100. The electrical power distribution system, includes a plurality of circuit protection devices. Each circuit protection device includes a network interface communicatively coupled to a communication network including the plurality of circuit protection devices, a processor, and a memory device. The method includes, at 1102, transmitting, by each circuit protection device of the plurality of circuit protection devices, a network communication signal to the communication network. The approximate physical distances between the circuit protection devices is determined 1104 based at least in part on a characteristic of the network communication signals transmitted by each circuit protection device. A maintenance mode of each circuit protection device of a subset of the circuit protection devices is enabled 1106 in response to enablement of a maintenance mode of one circuit protection device of the plurality of circuit protection devices. The subset of the circuit protection devices is determined at least in part by the approximate physical distance of the circuit protection devices from the maintenance mode enabled one circuit protection device.

In some embodiments, coordinated ground fault detection is provided by system 100. In such embodiments, circuit protection devices 106 share their detected current data with one or more other circuit protection devices 106. The circuit protection devices 106 that receive the current data are operable, such as by instruction stored in memory device 140, to use the received current data to determine whether or not a ground fault condition exists in system 100.

Figure 12:
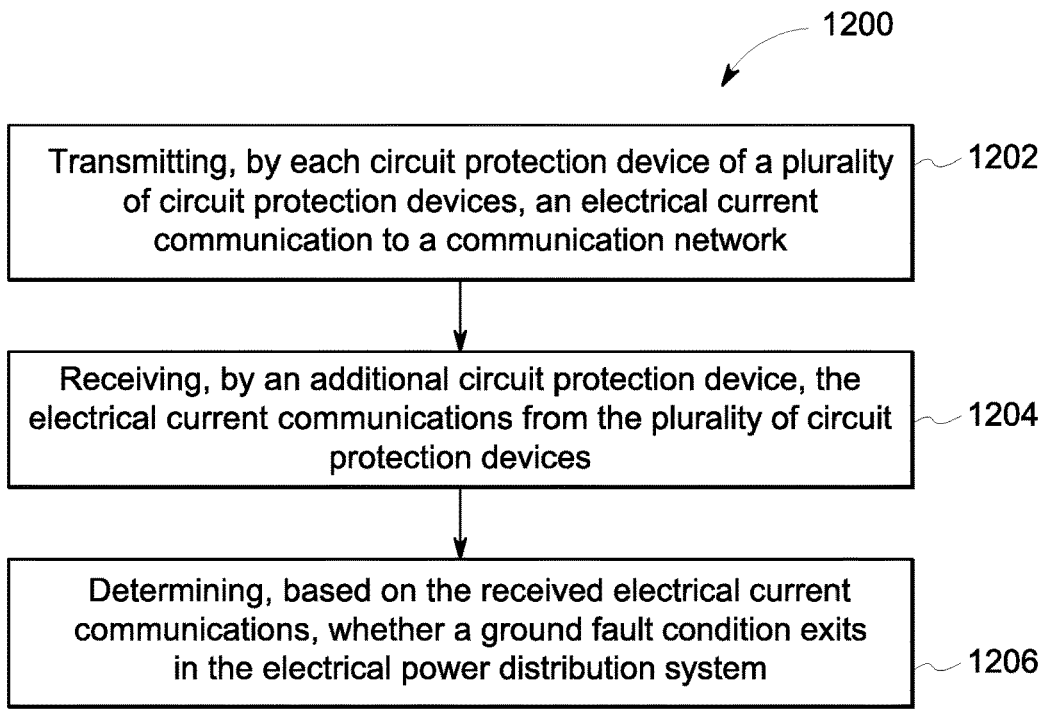
FIG. 12 is a flow diagram of an example method of coordinated ground fault detection operation of an electrical power distribution system.

FIG. 12 is a flow diagram of an example method 1200 of operating an electrical power distribution system, such as system 100, with coordinated ground fault detection. Method 1200 will be described with reference to system 100 and components of system 100. However, method 1200 may be used with any suitable electrical power distribution system.

At 1202, each circuit protection device 106 of a plurality of circuit protection devices 106 transmits an electrical current communication to a communication network. The electrical current communication includes an indication of an electrical current measured by the circuit protection device 106 using a current sensor 134. using a current sensor 134. The electrical current communication is a formatted according to the network protocol of the communication network to which circuit protection devices 106 are coupled.

In the example embodiment, each circuit protection device 106 transmits its electrical current communication to only one circuit protection device 106 that will act as a decision maker, with respect to ground fault detection, for circuit protection devices 106. In other embodiments, each circuit protection device 106 transmits its electrical current communication to all other circuit protection devices 106 and any or all of the circuit protection devices 106 may perform the further steps of method 1200 discussed below.

The indication of the electrical current included in the electrical current communication is determined by each circuit protection device 106 from a current signal received from its current sensor 134. In some embodiments, each circuit protection device 106 converts the current signal into an amount of detected current and includes the amount of detected current in the electrical current communication. In other embodiments, the value of the current signal is included in the electrical current communication and the receiving circuit protection device 106 converts the value of the current signal into the amount of detected current.

To determine whether or not a ground fault condition exists, the electrical current for each circuit protection device should be measured at the same time. In some embodiments, the time for current detection is based on an clock signal within each circuit protection device 106. In other embodiments, the time is determined based on a synchronization signal. The synchronization signal may be transmitted to circuit protection devices 106 by one of circuit protection devices 106 or by any other suitable component. In some embodiments, the particular circuit protection device 106 that will act as a decision maker for ground fault detection transmits the synchronization signal. In some embodiments, the particular circuit protection device 106 transmits a request for the electrical current communication to the other circuit protection devices 106. In response to the receipt of the request, each receiving circuit protection device 106 detects its current at the time of receipt, thus allowing the request to function as a synchronization signal.

At 1204, an additional circuit protection device 106 receives the electrical current communications from the plurality of circuit protection devices 106. As discussed above, each circuit protection device 106 may function as the additional circuit protection device or a single circuit protection device 106 may be designated to function as the additional circuit protection device 106.

The additional circuit protection device 106 determines, at 1206 and based on the received electrical current communications, whether a ground fault condition exists in the electrical power distribution system. A ground fault is identified by summing the values of the currents received in the electrical current communications. If the sum of the values is zero, there is no ground fault. If the sum does not equal zero, a ground fault condition exists. In multi-phase systems, the summing may include calculating a vector sum of the current in each electrical phase in system 100. In other embodiments, any suitable method for detecting a ground fault based on current measurements from circuit protection devices 106 may be used.

In some embodiments, method 1200 includes tripping a trip unit to interrupt electrical current in electrical power distribution system 100 in response to the additional circuit protection device 106 determining that a ground fault condition exists in system 100. If the additional circuit protection device 106 is located electrically upstream from the detected ground fault condition, the additional circuit protection device 106 may trip its own circuit protection device. In some embodiments, the additional circuit protection device 106 transmits a trip command to another circuit protection device 106 to cause it to trip its trip unit. The target of the trip command may be predetermined, such as the most upstream circuit protection device 106 in system 100. In other embodiments, the target of the trip command may be determined at the time of ground fault condition detection. For example, the target of the trip command may be based on the location of the ground fault condition. In such an embodiment, the additional circuit protection device 106 determines what portion of system 100 is affected by the ground fault condition, determines one or more circuit protection devices 106 that protect the determined portion, and transmits a trip command to each of the circuit protection devices 106 that protect the determined portion.

In at least some embodiments, the power distribution systems described herein are configured to facilitate testing and/or simulation of electrical conditions within the power distribution systems. More specifically, each circuit protection device and/or other component within the power distribution system receives test data representing an electrical condition and generates response data (e.g., circuit protection data) representing a simulated response of the device. As used herein, "simulating" electrical conditions and responses to such conditions refers to the circuit protection devices analyzing the test data associated with the electrical condition using the same or substantially similar process as measured data. However, unlike measured data, the circuit protection devices do not actually change their operational parameters (e.g., trip riming sequence, operational mode, etc.) or cause a trip unit to interrupt current when simulating a response. Rather, the response data indicates what test data the circuit protection device received and the changes that would have been made in response to the test data. The response data is aggregated at a system-level using a communication network to facilitate system-level analysis of the power distribution system for the tested electrical condition. The analysis is repeatable for a plurality of electrical conditions. System-level analysis for a plurality of electrical conditions facilitates reduced testing time in comparison to previous testing systems for power distribution systems. In these testing systems, each circuit protection device is manually and individually tested, which may be a time-consuming process that potentially delays the normal operation of the power distribution system.

As used herein, an "electrical condition" refers to parameters and instructions that affect the electrical response of the power distribution system. In one example, a fault within the power distribution system is an electric condition. In another example, a maintenance mode for circuit protection devices that adjusts the electrical response of the circuit protection devices is an electrical condition. The electrical condition may be represented as set of predetermined voltage, current, and/or power values. Additionally or alternatively, the electrical condition may be represented as one or more commands or instructions received by the circuit protection devices in the power distribution system. In at least some embodiments, during setup of the electrical power distribution system, the system is tested for a plurality of electrical conditions to ensure the system is configured to operate properly. These tests may be repeated periodically during operation to proactively detect problems developing within the system such that the problems may be addressed prior to the actual electrical condition occurring.

Figure 13:
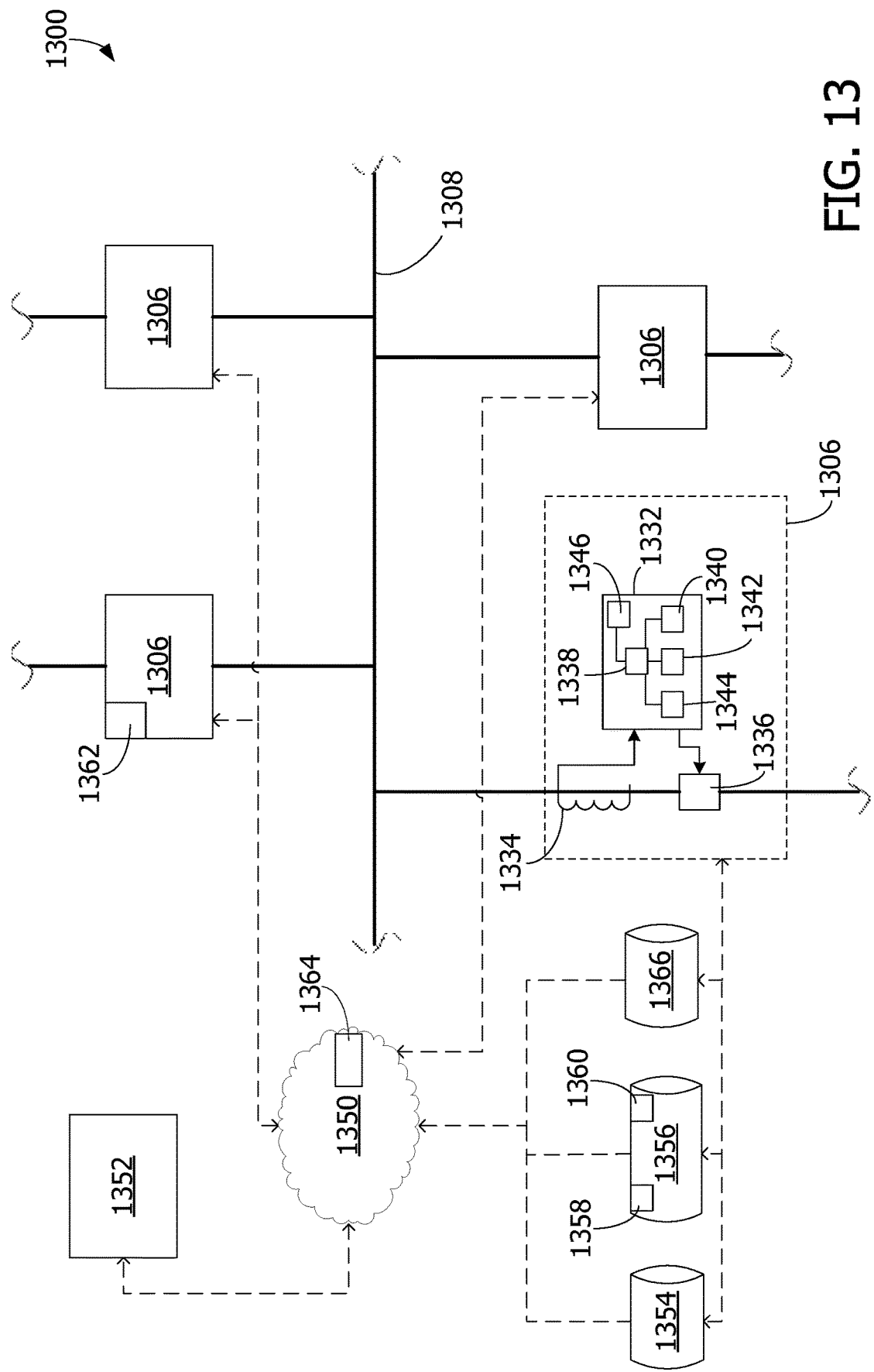
FIG. 13 is a data flow diagram of an exemplary power distribution system similar to the electrical power distribution system shown in FIG. 1 for testing the response of the system to various electrical conditions.

FIG. 13 is a data flow diagram of an exemplary power distribution system 1300 for testing the response of system 1300 to various electrical conditions. In the exemplary embodiment, system 1300 is similar to power distribution system 100 (shown in FIG. 1), and in the absence of contrary representation, system 1300 includes similar components. That is, system 1300 includes a plurality of circuit protection devices 1306 electrically coupled together through distribution bus 1308. In other embodiments, system 1300 includes a different number of circuit protection devices 1306 in a different configuration (e.g., the configuration shown in FIG. 1). Circuit protection devices 1306 are communicatively coupled to each other within a communication network 1350 as described herein. Each circuit protection device 1306 includes an integrated trip unit 1332, a sensor 1334, and a trip mechanism 1336. Trip unit 1332 includes a processor 1338 coupled to a memory 1340, an input device 1342, a display device 1344, and a network interface 1346. In other embodiments, system 1300 and/or circuit protection device 1306 may include additional, fewer, or alternative components, including those described elsewhere herein.

At least one of circuit protection devices 1306 is communicatively coupled to a remote access device 1352. Remote access device 1352 is a computing device that enables a user to monitor data from circuit protection device 1306. In some embodiments, remote access device 1352 is communicatively coupled to communication network 1350. In other embodiments, remote access device 1352 is communicatively coupled to one or more circuit protection devices 1306 using a different communication network. Circuit protection devices 1306 are configured to generate, transmit, and receive circuit protection data 1354 (also sometimes referred to as "operational data"). Circuit protection data 1354 includes one or more parameters, instructions, notifications, and/or other data associated with circuit protection devices 1306.

To test system 1300 for a particular electrical condition, remote access device 1352 is configured to generate a test message 1356 and transmit test message 1356 to one or more circuit protection devices 1306. Test message 1356 includes test data 1358 that represents or simulates the electrical condition. That is, test data 1358 includes one or more electrical parameters or control signals that simulate the electrical condition. For example, to simulate a fault condition in system 1300, test data 1358 includes current data that, when measured by circuit protection device 1306 near the simulated fault condition, would cause trip unit 1332 to trip. In at least some embodiments, test message 1356 further includes a test identifier 1360. Test identifier 1360 indicates to circuit protection devices 1306 that test data 1358 is associated with a test or simulation. Test identifier 1360 enables circuit protection devices 1306 to differentiate between measured data and test data 1358. In certain embodiments, during standard operation of system 1300, circuit protection devices 1306 are configured to operate and respond to measured data in parallel to testing responses to electrical conditions, thereby facilitating testing without interrupting operation of system 1300. In some embodiments, test message 1356 is generated by circuit protection device 1306. For example, in one embodiment, remote access device 1352 may transmit an initial test message 1356 to circuit protection devices 1306 for a recurring test such that subsequent test messages 1356 are generated by at least one circuit protection device 1306.

Circuit protection devices 1306 are configured to respond to test data 1358 similar to measured data (e.g., measured current data) from system 1300. That is, circuit protection devices 1306 receive test data 1358, analyze test data 1358 for any electrical conditions and/or command instructions, and generate circuit protection data 1354 based on the analysis. Circuit protection data 1354 includes metadata similar to test identifier 1360 that identifies circuit protection data 1354 as associated with test message 1356. In the exemplary embodiment, circuit protection data 1354 includes data associated with, for example and not limited to, "measured" electrical parameters, trip responses, operational modes (e.g., maintenance mode), ZSI data, and/or device parameters, such as trip timing sequences.

However, unlike the measured data, test data 1358 does not cause, for example, trip unit 1332 to trip or circuit protection device 1306 to switch operating modes (e.g., to a maintenance mode). More specifically, circuit protection device 1306 simulates a response to test data 1358 without changing the present operation of circuit protection device. 1306. For example, circuit protection data 1354 may include trip data that includes an electric current value, a voltage value, a power value, a trip timing sequence, and/or other data element associated with a simulated trip response of trip unit 1332.

In the exemplary embodiment, circuit protection devices 1306 are configured to store a set of test operational parameters 1362. The test operational parameters 1362 represent the operation of circuit protection devices 1306, and may include measured current data, trip timing sequences, trip thresholds, ZSI thresholds, operational modes, and/or the like. Test operational parameters 1362 do not affect the actual operation of circuit protection devices 1306, but rather affect the simulated responses of circuit protection devices 1306 to test data 1358 and circuit protection data 1354. Test operational parameters 1362 may reset for each test performed by system 1300. Additionally or alternatively, separate test operational parameters 1362 are generated and stored for each test. In certain embodiments, test operational parameters 1362 are defaulted to the actual operating parameters of circuit protection devices 1306 at the time of the test. In at least some embodiments, at least some test operational parameters are included in circuit protection data 1354.

Circuit protection data 1354 is transmitted to other circuit protection devices 1306 and/or remote access device 1352. In some embodiments, circuit protection device 1306 that generated circuit protection data 1354 adds circuit protection data 1354 to test message 1356 and transmits test message 1356 to another circuit protection device 1306. If circuit protection data 1354 is transmitted to other circuit protection devices 1306 through network 1350, the other circuit protection devices 1306 are configured to generate additional circuit protection data based at least partially on circuit protection data 1354. For example, as described herein, if a first circuit protection device 1306 identifies a fault, the first protection device 1306 includes a ZSI signal in circuit protection data 1354 and transmits data 1354 to an upstream circuit protection device 1306. The upstream circuit protection device 1306 detects the ZSI signal and simulates adjusting its trip timing sequence based on the detected ZSI signal.

In the exemplary embodiment, circuit protection data 1354 from circuit protection devices 1306 is aggregated within a simulation log 1364. Simulation log 1364 facilitates a system-level analysis of circuit protection data 1354. In at least some embodiments, simulation log 1364 includes a device identifier and timestamp for each response event (e.g., a trip response, a ZSI signal, etc.) to enable timing analysis of circuit protection data 1354. Simulation log 1364 may also include test data 1358 to indicate which electrical condition was tested. In the exemplary embodiment, access device 1352 is configured to collect circuit protection data 1354 and generate simulation log 1364 for analysis. In other embodiments, simulation log 1364 may be generated by circuit protection devices 1306 as circuit protection data 1354 is generated in response to test message 1356. In one example, simulation log 1364 is transmitted to each circuit protection device 1306 such that simulation log 1364 is updated with circuit protection data 1354 at each circuit protection device 1306.

Remote access device 1352 is configured to facilitate system-level analysis of circuit protection data 1354 and/or simulation log 1364 to monitor the response of circuit protection devices 1306 to the tested electrical condition. Unlike some known testing systems that individually test each circuit protection device 1306, simulation log 1364 facilitates analysis of the interaction between circuit protection devices 1306 and identifying any issues with multiple circuit protection devices 1306 simultaneously. In at least some embodiments, remote access device 1352 is configured to display simulation log 1364 and/or circuit protection data 1354 to a user (not shown) to enable the user to perform the system-level analysis. In certain embodiments, remote access device 1352 and/or circuit protection devices 1306 may analyze simulation log 1364 and/or circuit protection data 1354 to detect any potential errors, warnings, or other issues within the data.

In certain embodiments, at least one circuit protection device 1306 is configured to analyze circuit protection data 1354 and/or simulation log 1364 to generate a recommendation 1366. Recommendation 1366 indicates an adjustment within system 1300, such as adjusting one or more parameters of circuit protection device(s) 1306, that may improve the performance of system and/or fixes a potential error in system 1300 (e.g., miscalibrated circuit protection devices 1306). A user analyzes recommendation 1366 to determine whether or not to apply the recommended adjustment. In some embodiments, if a user approves recommendation 1366, system 1300 automatically applies the recommended adjustment. In one embodiment, circuit protection devices 1306 are automatically calibrated without recommendation 1366.

Figure 14:
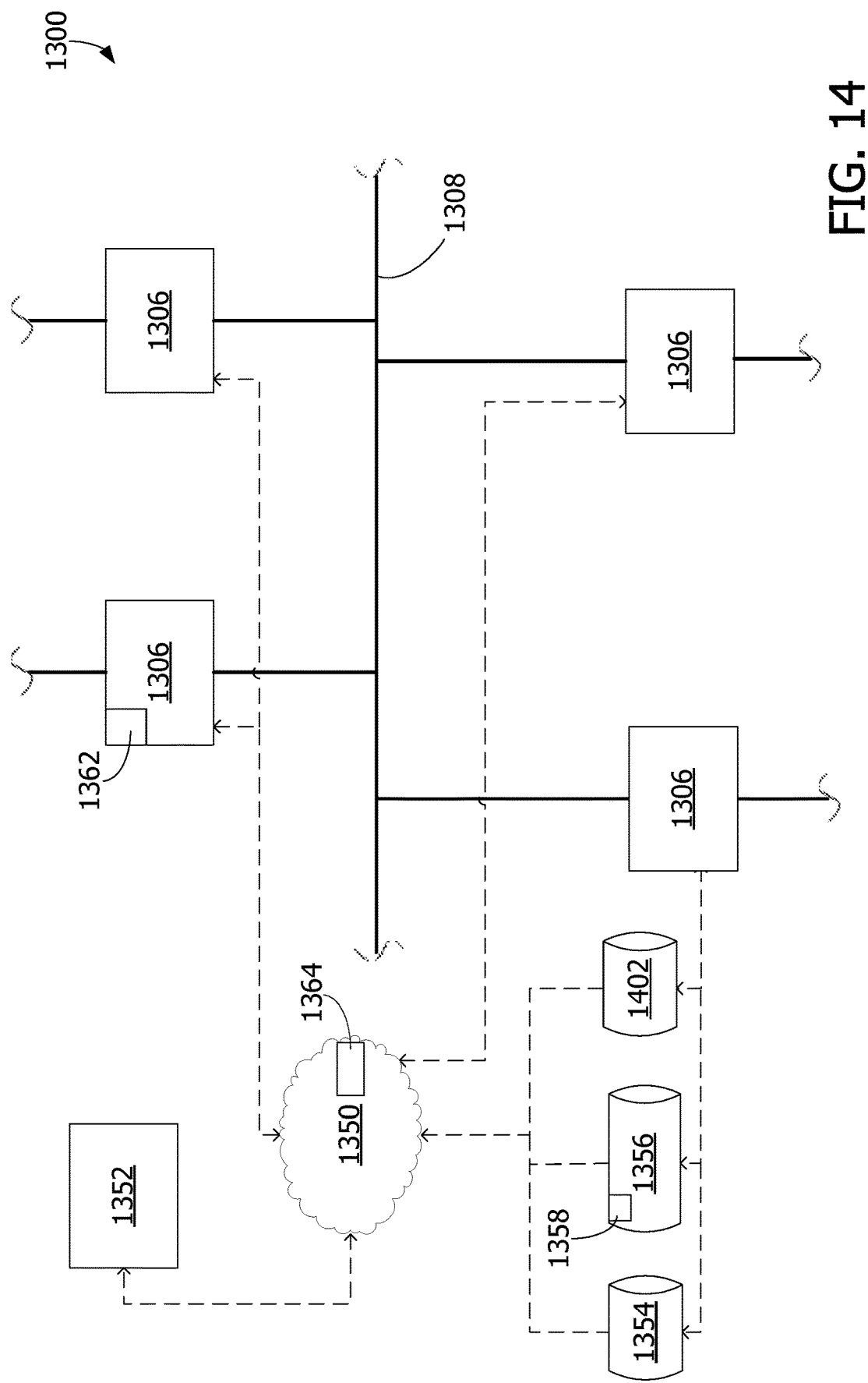
FIG. 14 is a data flow diagram of the power distribution system shown in FIG. 13 during exemplary testing for zone selective interlock (ZSI).

FIG. 14 is a data flow diagram of power distribution system 1300 shown in FIG. 13 during exemplary testing for ZSI. More specifically, circuit protection devices 1306 are tested to determine the trip response and trip timing sequence for each circuit protection device 1306 during a fault condition.

With respect to FIGS. 13 and 14, in the exemplary embodiment, when testing ZSI in system 1300, test data 1358 includes data representing a fault condition within system 1300. More specifically, test data 1358 includes data representing a current exceeding a ZSI threshold at one or more circuit protection devices 1306. When a first circuit protection device 1306 determines test data 1358 includes a "measured" current at the first circuit protection device 1306 exceeds the ZSI threshold, the first circuit protection device 1306 transmits test ZSI data 1402 to the other circuit protection devices 1306 through network 1350. In some embodiments, the first circuit protection device 1306 transmits test ZSI data 1402 to one or more upstream circuit protection devices. Test ZSI data 1402 is substantially similar or identical to the ZSI data transmitted by circuit protection device 1306 when the actual measured current exceeds the ZSI threshold. Test ZSI data 1402 includes metadata that indicates test ZSI data 1402 is associated with test data 1358 such that circuit protection devices 1306 that receive test ZSI data 1402 do not change switch operating modes in response. Rather, in some embodiments, circuit protection devices 1306 store test operational parameters 1362 associated with test data 1358. In the exemplary embodiment, test ZSI data 1402 is included in simulation log 1364.

Circuit protection devices 1306 analyze received test ZSI data 1402 and determine whether to simulate changing operational modes (e.g., an unrestrained mode to a restrained mode) based at least in part on the analysis. If circuit protection devices 1306 simulate changing from a first operational mode to a second operational mode, circuit protection data 1354 generated by the changed circuit protection devices 1306 and simulation log 1364 indicate the operational mode change. The changed circuit protection devices 1306 simulate responses to subsequent received test data 1358 and circuit protection data 1354 according to the second operational mode. In one example, when a first circuit protection device 1306 simulates switching to a restrained mode, the first circuit protection device 1306 simulates a restrained trip timing sequence for test data 1358 representing a measured current at the first current protection device 1306.

Figure 15:
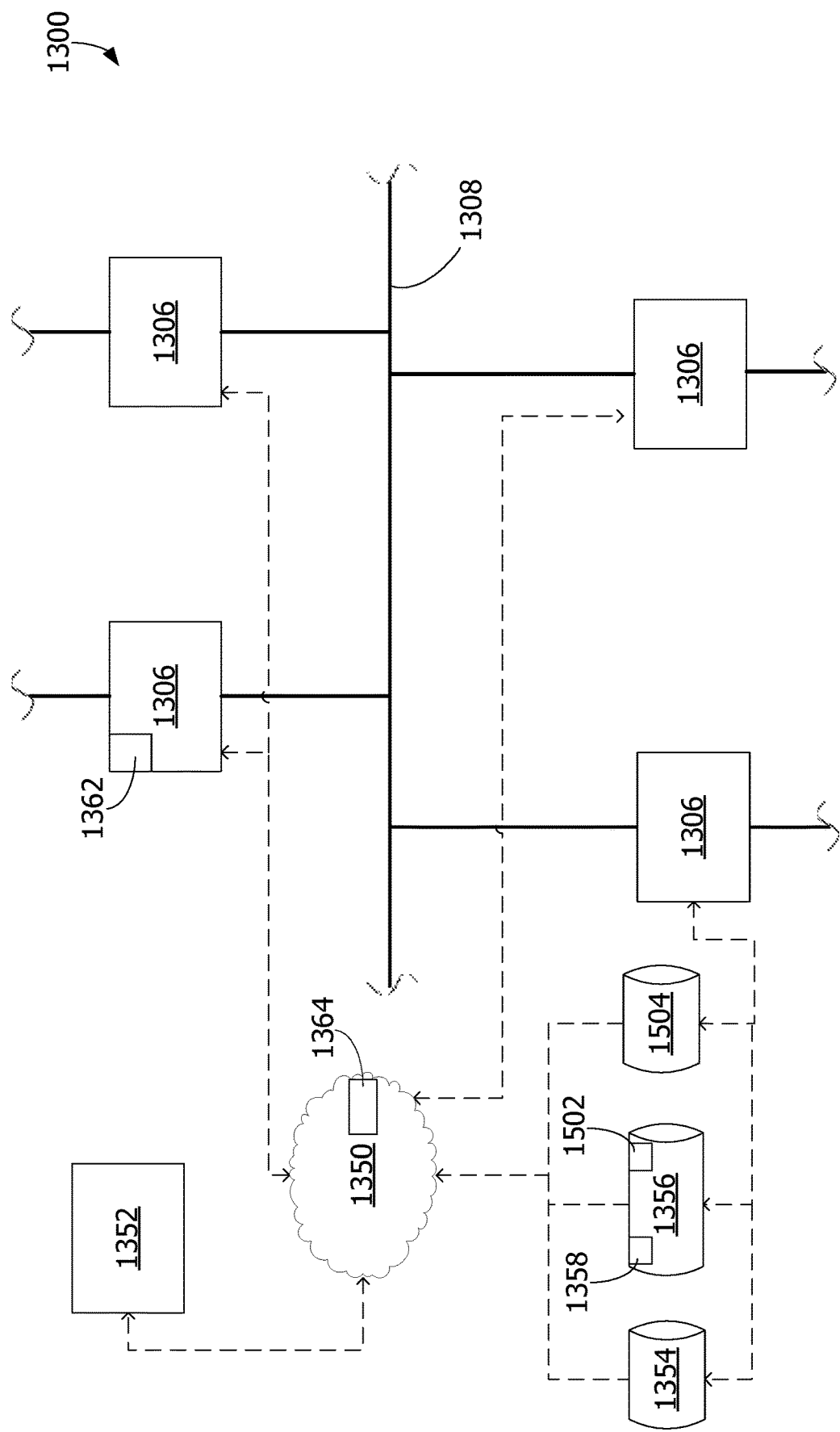
FIG. 15 is a data flow diagram of the power distribution system shown in FIG. 13 during exemplary testing maintenance modes for circuit protection devices.

FIG. 15 is a data flow diagram of power distribution system 1300 shown in FIG. 13 during exemplary testing maintenance modes for circuit protection devices. More specifically, circuit protection devices 1306 are tested to simulate a maintenance condition. The maintenance condition represents the physical presence of a maintenance worker or other user proximate to one or more circuit protection devices 1306.

With respect to FIGS. 13 and 15, in the exemplary embodiment, test message 1356 includes a maintenance mode instruction 1502. Maintenance mode instruction 1502 causes one or more circuit protection devices 1306 to simulate switching to a maintenance mode. That is, circuit protection devices 1306 adjust stored test operational parameters without actually switching to the maintenance mode such that circuit protection devices 1306 analyzes and responds to subsequent test data 1358 based on the adjusted test operational parameters. Circuit protection devices 1306 that simulate switching to the maintenance mode transmit a test maintenance status message 1504 to at least a portion of circuit protection devices 1306. Test maintenance status message 1504 is substantially similar to the maintenance status message generated when circuit protection device 1306 actually switches to the maintenance mode. Test maintenance status message 1504 includes metadata that indicates test maintenance status message is associated with test message 1356. In the exemplary embodiment, test maintenance status message 1504 is included in simulation log 1364.

In response to test maintenance status message 1504, circuit protection devices 1306 determine whether or not to simulate switching to the maintenance mode. In the exemplary embodiment, each circuit protection device 1306 determines a physical distance between a first circuit protection device 1306 in the maintenance mode and the particular circuit protection device 1306. If the physical distance is within one or more predetermined distance thresholds, circuit protection device 1306 may simulate switching to the maintenance mode and transmit a test maintenance status message 1504 to other circuit protection devices 1306. If the physical distance exceeds the distance thresholds, circuit protection devices 1306 may continue to operate according to their present operating mode specified in the stored test operational parameters. In some embodiments, rather than determining a physical distance, circuit protection devices 1306 identify a zone of proximity associated with test maintenance status message 1504. If circuit protection device 1306 is physically within the identified zone, circuit protection device 1306 may simulate switching to the maintenance mode.

Exemplary embodiments of power distribution systems and methods of operating power distribution systems and/or circuit protection devices are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the power system as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical power distribution system comprising:
a plurality of circuit protection devices coupled to an electrical power source, each circuit protection device comprising:
 a network interface communicatively coupled to a communication network including said plurality of circuit protection devices;
 an electrical current sensor configured to detect an electrical current associated with its circuit protection device;
 a processor; and
 a memory device storing instructions that, when executed by said processor, cause said processor to transmit, using said network interface, an electrical current communication to the communication network, the electrical current communication including an indication of the detected electrical current associated with said circuit protection device formatted according to a network communication protocol of the communication network; and
an additional circuit protection device coupled to the electrical power source, said additional circuit protection device comprising:
 an additional network interface communicatively coupled to the communication network;
 an additional processor; and
 an additional memory device storing instructions that, when executed by said additional processor, cause said additional processor to:
  receive, using said additional network interface, the electrical current communications from said plurality of circuit protection devices;
  determine, based on the received electrical current communications, whether a ground fault condition exists in said electrical power distribution system; and
  identify a portion of said electrical power distribution system associated with a ground fault condition that is determined by said additional processor to exist.

2. An electrical power distribution system in accordance with claim 1, wherein said additional circuit protection device is disposed electrically upstream from said plurality of circuit protection devices.

3. An electrical power distribution system in accordance with claim 2, wherein said additional circuit protection device further comprises a trip unit configured to interrupt a flow of electrical current through said additional circuit protection device, and wherein said additional memory device includes instructions that, when executed by said additional processor, cause said additional processor to trip said trip unit to interrupt the flow of electrical current through said additional circuit protection device when said additional processor determines a ground fault condition exists in said electrical power distribution system.

4. An electrical power distribution system in accordance with claim 1, wherein said additional memory device includes instructions that, when executed by said additional processor, cause said additional processor to transmit, using said network interface, a trip command to at least one circuit protection device of said plurality of circuit protection devices when said additional processor determines a ground fault condition exists in said electrical power distribution system.

5. An electrical power distribution system in accordance with claim 4, wherein said additional memory device includes instructions that, when executed by said additional processor, cause said additional processor to determine at least one circuit protection device that protects the determined portion of said electrical power distribution system, wherein transmitting the trip command to at least one circuit protection device comprise transmitting the trip command to the at least one circuit protection device that is determined to protect the determined portion of said electrical power distribution system.

6. An electrical power distribution system in accordance with claim 1, wherein each circuit protection device's memory device stores instructions that, when executed by its associated processor, cause said processor to transmit the electrical current communication to said additional circuit protection device through the communication network.

7. An electrical power distribution system in accordance with claim 1, wherein each circuit protection device's memory device stores instructions that, when executed by its associated processor, cause said processor to transmit the electrical current communication to said additional circuit protection device and each other circuit protection device of said plurality of circuit protection devices through the communication network.

8. An electrical power distribution system in accordance with claim 1, wherein each circuit protection device's memory device stores instructions that, when executed by its associated processor, cause said processor to detect the electrical current associated with its circuit protection device at a same time as each other circuit protection device of said plurality of circuit protection devices.

9. An electrical power distribution system in accordance with claim 8, wherein said additional memory device includes instructions that, when executed by said additional processor, cause said additional processor to transmit a synchronization signal to each circuit protection device that determines the same time at which each circuit protection device detects its associated electrical current.

10. An electrical power distribution system in accordance with claim 1, wherein each circuit protection device's current sensor is configured to produce a current signal indicative of the amount of electrical current measured by said current sensor, and wherein each circuit protection device's memory device stores instructions that, when executed by its associated processor, causes said processor to convert the current signal to the amount of electrical current measured by said current sensor.

11. An electrical power distribution system in accordance with claim 1, wherein said additional memory device includes instructions that, when executed by said additional processor, cause said additional processor to determine whether a ground fault condition exists in said electrical power distribution system by summing the electrical currents detected by said plurality of circuit protection devices.

12. A circuit protection device for an electrical distribution system including a plurality of other circuit protection devices, said circuit protection device comprising:
- a network interface configured to be communicatively coupled to a communication network including the plurality of other circuit protection devices;
- a processor; and
- a memory device storing instructions that, when executed by said processor, cause said processor to:
  - receive, using said network interface, an electrical current communication from each other circuit protection device, the electrical current communication from each other circuit protection device includes an indication of an amount of an electrical current associated with the other circuit protection device;
  - determine an approximation of physical proximity of each other circuit protection device to the circuit protection device; and
  - determine, based on the received electrical current communications and the approximations of physical proximity, whether a ground fault condition exists in a portion of the electrical power distribution system.

13. A circuit protection device in accordance with claim 12, further comprising a trip unit configured to interrupt a flow of electrical current through said circuit protection device, and wherein said memory device includes instructions that, when executed by said processor, cause said processor to trip said trip unit to interrupt the flow of electrical current through said circuit protection device when said processor determines a ground fault condition exists in the electrical power distribution system.

14. A circuit protection device in accordance with claim 12, wherein said memory device includes instructions that, when executed by said processor, cause said processor to transmit, using said network interface, a trip command to at least one other circuit protection device of the plurality of other circuit protection devices when said processor determines a ground fault condition exists in the electrical power distribution system.

15. A circuit protection device in accordance with claim 14, wherein said memory device includes instructions that, when executed by said processor, cause said processor to:
- determine the portion of the electrical power distribution system associated with a ground fault condition that is determined by said processor to exist; and
- determine at least one other circuit protection device of the plurality of other circuit protection devices that protects the determined portion of the electrical power distribution system, wherein transmitting the trip command to at least one other circuit protection device comprises transmitting the trip command to the at least one other circuit protection device that is determined to protect the determined portion of the electrical power distribution system.

16. A circuit protection device in accordance with claim 12, wherein said memory device includes instructions that, when executed by said processor, cause said processor to transmit a synchronization signal to the plurality of other circuit protection devices to indicate a same time at which each other circuit protection device is to detect its associated electrical current.

17. A method of operating an electrical power distribution system comprising a plurality of circuit protection devices and an additional circuit protection device communicatively coupled by a communications network, said method comprising:
- receiving, by the additional circuit protection device, electrical current communications formatted according to a network communication protocol of the communication network from each of the plurality of circuit protection devices, the electrical current communications including indications of electrical currents measured by current sensors of the plurality of circuit protection devices;
- converting, by the additional circuit protection device, the electrical current communications to an amount of electrical current measured by each current sensor of the plurality of circuit protection devices; and
- determining, by the additional circuit protection device and based on the amount of electrical current measured by each current sensor of the plurality of circuit protection devices, whether a ground fault condition exists in the electrical power distribution system.

18. A method in accordance with claim 17, further comprising tripping a trip unit to interrupt electrical current in the electrical power distribution system in response to the additional circuit protection device determining that a ground fault condition exists in the electrical power distribution system.

19. A method in accordance with claim 18, wherein the additional circuit protection device is disposed electrically upstream from the plurality of circuit protection devices, and wherein tripping the trip unit comprises tripping, by the additional circuit protection device, the additional circuit protection device's trip unit.

20. A method in accordance with claim 18, further comprising:

determining, by the additional circuit protection device, a portion of the electrical power distribution system associated with the determined ground fault condition; and determining, by the additional circuit protection device, at least one circuit protection device of the plurality of circuit protection devices that protects the determined portion of the electrical power distribution system; and transmitting, by the additional circuit protection device, a trip command to the circuit protection device that protects the determined portion of the electrical power distribution system.

\* \* \* \* \*